United States Patent
Nakase et al.

(10) Patent No.: US 6,392,897 B1
(45) Date of Patent: May 21, 2002

(54) CIRCUIT MODULE

(75) Inventors: Yasunobu Nakase; Tsutomu Yoshimura; Yoshikazu Morooka; Naoya Watanabe, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/131,688

(22) Filed: Aug. 10, 1998

(30) Foreign Application Priority Data

Mar. 6, 1998 (JP) ............................................ 10-055202

(51) Int. Cl.⁷ .............................................. H01R 12/16
(52) U.S. Cl. ..................... 361/785; 361/760; 361/772; 361/783; 361/764; 257/686; 257/777; 439/59; 439/61; 439/62; 228/180.21; 228/180.1
(58) Field of Search ................................. 361/785, 760, 361/773, 772, 783, 820, 763, 764; 257/686, 777, 797; 439/59, 61, 62; 228/180.21, 180.1

(56) References Cited

U.S. PATENT DOCUMENTS

| | | | | |
|---|---|---|---|---|
| 5,103,247 A | * | 4/1992 | Sugano et al. | 361/785 |
| 5,227,664 A | * | 7/1993 | Toshio et al. | 257/723 |
| 5,412,538 A | * | 5/1995 | Kikinis et al. | 361/792 |
| 5,513,135 A | * | 4/1996 | Dell et al. | 365/52 |
| 5,708,297 A | * | 1/1998 | Clayton | 257/723 |
| 5,754,408 A | * | 5/1998 | Derouiche | 361/773 |
| 5,838,549 A | * | 11/1998 | Nagata et al. | 361/794 |
| 5,941,447 A | * | 8/1999 | Chu et al. | 228/180.21 |
| 5,995,378 A | * | 11/1999 | Farnworth et al. | 361/796 |
| 5,996,880 A | * | 12/1999 | Chu et al. | 228/180.21 |

FOREIGN PATENT DOCUMENTS

| | | |
|---|---|---|
| JP | 5-250866 | 9/1993 |
| JP | 7-38290 | 2/1995 |
| JP | 9-162572 | 6/1997 |
| TW | 325941 | 1/1998 |

OTHER PUBLICATIONS

Billy Garrett, "Direct Rambus RIMM Module 128 Mbytes (64M×16/18)," Advance Information, 128 Mbyte RIMM Module Data Sheet, Oct. 9, 1997, pp. 1–15.

* cited by examiner

Primary Examiner—Leo P. Picard
Assistant Examiner—David Foster
(74) Attorney, Agent, or Firm—Oblon, Spivak, McClelland, Maier & Neustadt, P.C.

(57) ABSTRACT

A circuit module includes a connector terminal (4A) provided on a front surface of a printed wiring board (2) and connected to a data pin ($DQ_i$) of a memory IC (3) through an interconnect line (5a). A conductive connector terminal (4c) corresponds to the connector terminal (4a) and is provided on a back surface of the printed wiring board (2). A through hole (16) extends between part of the front surface of the printed wiring board (2) where the connector terminal (4a) is formed and part of the back surface thereof where the conductive connector terminal (4c) is formed. A conductor fills the through hole (16), thereby suppressing skews resulting from a difference in interconnect line length on the circuit module and decreasing a stub capacitance to achieve the reduction in power consumption.

19 Claims, 19 Drawing Sheets

CIRCUIT MODULE

BACKGROUND OF THE INVENTION

1. Field of the Invention

The present invention relates to a circuit module including semiconductor ICs mounted on a printed wiring board and, more particularly, to a memory module which achieves an increased signal transfer rate.

2. Description of the Background Art

A circuit module comprises a plurality of semiconductor ICs having the same function and mounted on a printed wiring board in conjunction with a control IC, as required. The most common semiconductor ICs to be mounted include a memory IC. Thus, description will now be given using a memory module as an example.

FIG. 16 is a front view of a conventional memory module 101. A plurality, illustrated herein as four, of memory ICs 103 are mounted on a printed wiring board 102. Each of the memory ICs 103 includes pins $DQ_0$ to $DQ_n$ which are data pins for inputting and outputting data signals where n is a natural number. For example, n=7 when a memory IC 103 has eight data pins. The reference character $DQ_t$ ($0 \leq t \leq n$) is used hereinafter to generically represent the data pins. An individual data signal is inputted to and outputted from each data pin $DQ_t$ of each of the memory ICs 103. Thus, when the four memory ICs 103 each having eight data pins are mounted on the printed wiring board 102 as shown in FIG. 16, 32 (4×8) connector terminals among a plurality of connector terminals 104 of the memory module 101 function as connector terminals 104a for the data signals. The connector terminals 104a and the data pins $DQ_0$ to $DQ_n$ are connected to each other by interconnect lines 105a provided on the printed wiring board 102. For purposes of simplification, only the connection between the data pins $DQ_0$ to $DQ_n$ of one of the memory ICs 103 which is positioned at the top of the drawing paper (or the rightmost memory IC 103) and the connector terminals 104 is typically shown in FIG. 16.

Each of the memory ICs 103 further includes pins $A_0$ to $A_k$ which are address/command pins for inputting address signals or command signals (referred to hereinafter together as "address/command signals") to each memory IC 103 where k is a natural number. For example, k=7 when a memory IC 103 has eight address/command pins. The reference character $A_s$ ($0 \leq s \leq k$) is used hereinafter to generically represent the address/command pins. Unlike the data signals to be inputted and outputted, an address/command signal is commonly inputted to the address/command pins $A_s$ of the respective memory ICs 103. Thus, when each of the memory ICs 103 includes eight address/command pins as shown in FIG. 16, eight connector terminals among the plurality of connector terminals 104 of the memory module 101 function as connector terminals 104b for the address/command signals. An interconnect line 105b provided on the printed wiring board 102 is connected to each of the plurality of connector terminals 104b.

FIG. 17 is a sectional view of the memory module 101, and particularly shows the memory module 101 in section as viewed in the direction of the arrow $Y_1$ of FIG. 16. With reference to FIGS. 16 and 17, the connection between the interconnect line 105b and the address/command pins $A_s$ is described hereinafter. Since the interconnect lines 105a are provided on the printed wiring board 102 as described above, an interconnect line for connecting the interconnect line 105b and the address/command pins $A_s$ is not permitted to be provided on the printed wiring board 102. For this reason, a lower interconnect line 105c extending in the direction perpendicular to the longitudinal direction of the interconnect line 105b is provided inside the printed wiring board 102, and the interconnect line 105b and the lower interconnect line 105c are connected to each other by a conductor which fills a through hole 106. Interconnect lines 108 for connection to the address/command pins $A_s$ are provided on the printed wiring board 102, and the interconnect lines 108 and the lower interconnect line 105c are connected to each other by a conductor which fills through holes 107. In this manner, the connection is established between the interconnect line 105b and the address/command pins $A_s$. This allows an address/command signal applied to the connector terminal 104b from the exterior to be transmitted in sequential order through the interconnect line 105b, the conductor which fills the through hole 106, the lower interconnect line 105c, the conductor which fills the through holes 107, the interconnect lines 108, and the address/command pins $A_s$ to the memory ICs 103.

FIG. 18 is a side view of the general configuration of a system including a plurality of memory modules each corresponding to the memory module 101. A signal line 111 is provided on a motherboard 109. The signal line 111 is connected at one end thereof to a controller 110 disposed on the motherboard 109, and is connected at the other end thereof to a terminating resistor 112 provided on the motherboard 109. The terminating resistor 112 is connected to a power supply 113 for providing a termination potential. A plurality of connectors 114 arranged at regularly spaced intervals in the longitudinal direction of the signal line 111 are provided also on the motherboard 109. The connectors 114 function to physically support the memory modules 101 inserted therein. The insertion of the plurality of memory modules 101 in the respective connectors 114 causes each of the plurality of memory modules 101 to be placed in an upright position, or to extend in the direction perpendicular to the longitudinal direction of the signal line 111. It should be noted that a connector 114 in which no memory module 101 is inserted as shown in FIG. 18 is present in some cases. The connectors 114 also function to establish electrical connection between the connector terminals 104 (not shown in FIG. 18) of the memory modules 101 and the signal line 111. Thus, the data signals and address/command signals outputted from the controller 110 are transmitted through the signal line 111 and the connectors 114 to the memory modules 101. The symbol d shown in FIG. 18 denotes the spacing (pitch) between adjacent memory modules 101.

FIG. 19 is a sectional view of the connector 114 with the memory module 101 inserted therein, and particularly shows the memory module 101 in section as viewed in the direction of the arrow $Y_2$ of FIG. 16. The interconnect line 105a and the data pins $DQ_t$ are illustrated in FIG. 19. A connector pin 115b and a conductive connector pin 115a which are on opposite sides of the memory module 101 hold the memory module 101 therebetween, thereby to support the memory module 101 in the connector 114. Electrical connection between the signal line 111 and the connector terminal 104a is made through the connector pin 115a.

With the increase in processor operating speeds, there has been a need to increase the signal transfer rate of the memory modules. Unfortunately, the conventional memory modules 101 described above present drawbacks to be described below in terms of the increase in the signal transfer rate, and are not capable of responding the need.

One of the drawbacks is as follows. The data signals must be synchronized when inputted to and outputted from the data pins $DQ_0$ to $DQ_n$ of the memory IC 103. In the memory module 101 shown in FIG. 16, however, there is a significant difference in length between an interconnect line $105a_0$ connected to the data pin $DQ_0$ and an interconnect line $105a_n$ connected to the data pin $DQ_n$, for example. If the data signals inputted from the controller 110 to the memory IC 103 are synchronous with each other on the signal line 111, the difference in length between the interconnect lines 105a causes the synchronism to be lost, resulting in phase differences between the data signals at the time the data signals are inputted to the memory IC 103. Similarly, if the data signals outputted from the data pins $DQ_0$ to $DQ_n$ of the memory IC 103 are synchronous with each other, the difference in length between the interconnect lines 105a causes the synchronism to be lost, resulting in phase differences between the data signals on the signal line 111. A difference of 1cm in length between the interconnect lines 105a produces a time difference (skew) of about 70 ps. The skew of 70 ps is not negligible in view of the fact that 1 ns is required for one cycle at a signal transfer rate of 1 gigabit/second for each pin.

Another drawback is as follows. It is assumed that the connector 114 and the memory module 101 are disregarded for consideration of the characteristics of the signal line 111. The characteristic impedance $Z_0$ of the signal line 111 is given by $$Z_0 = \sqrt{\frac{L \cdot d}{C \cdot d}} \qquad (1)$$

where C is the capacitance of the signal line 111 per unit length, and L is the inductance of the signal line 111 per unit length.

On the other hand, if the connector 114 and the memory module 101 are taken into consideration, the connector pin 115a and the interconnect line 105a are regarded as stubs branching off from the signal line 111. FIG. 20 is a circuit diagram of an equivalent circuit in this case. Since the wiring capacitances of the stubs and the input capacitance of the memory IC 103 (both referred to hereinafter together as "stub capacitances" in some cases) function as capacitive loads for the signal line 111, the signal line 111, in this case, has a characteristic impedance $Z_1$ given by $$Z_1 = \sqrt{\frac{L \cdot d}{C \cdot d + C_C + C_{LF} + C_{IN}}} \qquad (2)$$

where $C_C$ is the wiring capacitance of the connector pin 115a, $C_{LF}$ is the wiring capacitance of the connector terminal 104a and the interconnect line 105a, and $C_{IN}$ is the input capacitance of the memory IC 103.

The resistance of the terminating resistor 112 shown in FIG. 18 must be equal to the characteristic impedance $Z_1$ of the signal line 111 for the purpose of impedance matching for prevention of signal reflection. It will be found from Equation (2) that since the wiring capacitance $C_C$ is particularly high in the mounting of the memory module, the characteristic impedance $Z_1$ of the signal line 111 is low. Accordingly, the resistance of the terminating resistor 112 is required to be also low for the impedance matching. This results in an increased amount of power consumption. As an example, if the characteristic impedance $Z_0$ expressed by Equation (1) is 75 ohms, the characteristic impedance $Z_1$ of the signal line 111 for transmitting the data signals is reduced to about 35 ohms due to the mounting of the memory module 101. For the signal line 111 for transmitting the address/command signals, the wiring capacitance $C_{LF}$ and the input capacitance $C_{IN}$ are also high since the plurality of memory ICs 103 are connected to the interconnect line 105b. As a result, the resistance of the terminating resistor 112 is required to be lower, rendering the problem of the increase in power consumption more serious. To solve the problem, it is theoretically possible to increase the characteristic impedance $Z_1$ by increasing the pitch d of the memory modules 101. This, however, decreases a packaging density, and is not a satisfactory solution to the problem in view of such a requirement for computers that a fixed number of memories must be mounted in limited space.

SUMMARY OF THE INVENTION

A first aspect of the present invention is intended for a circuit module for insertion in a connector provided on a main surface of a motherboard including first and second signal lines separated from each other at the connector. According to the present invention, the circuit module comprises: a first connector terminal provided on a first main surface of a board and adapted for electrical connection to the first signal line through a first connector pin of the connector; a second connector terminal provided on a second main surface of the board, the second main surface being on opposite side of the board from the first main surface, the second connector terminal being adapted for electrical connection to the second signal line through a second connector pin of the connector; and a first interconnect line for providing electrical connection between the first connector terminal and the second connector terminal.

Preferably, according to a second aspect of the present invention, in the circuit module of the first aspect, the first interconnect line is a conductor that fills a through hole selectively extending between part of the first main surface of the board where the first connector terminal is formed and part of the second main surface of the board where the second connector terminal is formed.

Preferably, according to a third aspect of the present invention, in the circuit module of the first aspect, the first interconnect line is a metal interconnect line provided on a side surface of the board and in contact with both the first and second connector terminals.

Preferably, according to a fourth aspect of the present invention, in the circuit module of the first aspect, the connector includes a plurality of connectors formed on the main surface of the motherboard; a first one of the plurality of connectors includes third and fourth connector pins electrically connected respectively to the first and second signal lines separated from each other at the first connector; the first connector receives an IC module, the IC module having a first main surface and comprising a third connector terminal formed on the first main surface thereof and adapted for connection to the third connector pin, a second interconnect line formed on the first main surface thereof and having a first end connected to the third connector terminal, and a first IC formed on the first main surface thereof and connected to a second end of the second interconnect line, the IC module having a second main surface on opposite side from the first main surface thereof and further comprising a fourth connector terminal formed on the second main surface thereof and adapted for connection to the fourth connector pin, the IC module further comprising a third interconnect line for providing electrical connection between the third connector terminal and the fourth connector terminal; and the circuit module is inserted in a second one of the plurality of connectors, the second connector being not to receive the IC module.

Preferably, according to a fifth aspect of the present invention, the circuit module of the fourth aspect further comprises: a fourth interconnect line formed on the first main surface of the board thereof and having a first end connected to the first connector terminal; and a first capacitive element formed on the first main surface of the board thereof and connected to a second end of the fourth interconnect line, wherein the wiring capacitance of the fourth interconnect line is equal to that of the second interconnect line, and wherein the capacitance of the first capacitive element is equal to the input capacitance of the first IC.

Preferably, according to a sixth aspect of the present invention, in the circuit module of the fifth aspect, the IC module further comprises a fifth interconnect line formed on the second main surface thereof and having a first end connected to the fourth connector terminal, and a second IC formed on the second main surface thereof and connected to a second end of the fifth interconnect line, and the circuit module further comprises: a sixth interconnect line formed on the second main surface of the board thereof and having a first end connected to the second connector terminal; and a second capacitive element formed on the second main surface of the board thereof and connected to a second end of the sixth interconnect line, wherein the wiring capacitance of the sixth interconnect line is equal to that of the fifth interconnect line, and wherein the capacitance of the second capacitive element is equal to the input capacitance of the second IC.

Preferably, according to a seventh aspect of the present invention, in the circuit module of the fifth aspect, the IC module further comprises a fifth interconnect line formed on the second main surface thereof and having a first end connected to the fourth connector terminal, and a second IC formed on the second main surface thereof and connected to a second end of the fifth interconnect line, and the circuit module further comprises: a sixth interconnect line formed on the second main surface of the board thereof and having a first end connected to the second connector terminal; and a third IC formed on the second main surface of the board thereof and connected to a second end of the sixth interconnect line, wherein the wiring capacitance of the sixth interconnect line is equal to that of the fifth interconnect line, and wherein the input capacitance of the third IC is equal to that of the second IC.

Preferably, according to an eighth aspect of the present invention, in the circuit module of the first aspect, the first connector terminal includes a plurality of first connector terminals, and the circuit module further comprises: a plurality of interconnect lines formed on the first main surface of the board thereof and having first ends connected to the plurality of first connector terminals, respectively; and an IC formed on the first main surface of the board thereof and including a plurality of terminals connected to second ends of the plurality of interconnect lines, respectively, the plurality of terminals being arranged in a direction parallel to a direction in which the plurality of first connector terminals are arranged.

A ninth aspect of the present invention is also intended for a circuit module for insertion in a first connector provided on a main surface of a motherboard, the motherboard including a plurality of second connectors provided on the main surface thereof for receiving as required an IC module comprising an IC mounted thereon, a controller provided on the main surface thereof for providing a signal to the IC, and a signal line provided on the main surface thereof and having a first end connected to the controller. According to the present invention, the circuit module comprises: a first connector terminal adapted for electrical connection to the signal line through a first connector pin of the first connector; a first interconnect line having a first end connected to the first connector terminal; a terminating resistor connected to a second end of the first interconnect line, and a power supply for providing a termination potential to the terminating resistor, wherein the signal line is separated at the first and second connectors, wherein the IC module is inserted in each of such ones of the plurality of second connectors that are positioned between the first connector and the controller, and wherein the IC module is not inserted in such ones of the plurality of second connectors that are positioned farther from the controller than the first connector.

Preferably, according to a tenth aspect of the present invention, in the circuit module of the ninth aspect, the IC module further comprises a second connector terminal adapted for connection to the signal line through a second connector pin of each of the plurality of second connectors, and a second interconnect line for providing electrical connection between the second connector terminal and the IC, and the circuit module further comprises: a capacitive element connected to the first interconnect line in common with the terminating resistor, wherein the wiring capacitance of the first interconnect line is equal to that of the second interconnect line, and wherein the capacitance of the capacitive element is equal to the input capacitance of the IC.

An eleventh aspect of the present invention is also intended for a circuit module for insertion in a connector provided on a main surface of a motherboard having a plurality of signal lines. According to the present invention, the circuit module comprises: a plurality of connector terminals formed on a main surface of a board and adapted for connection to the plurality of signal lines through a plurality of connector pins of the connector, respectively; a plurality of interconnect lines formed on the main surface of the board and having first ends connected to the plurality of connector terminals, respectively; and an IC formed on the main surface of the board and including a plurality of terminals connected to second ends of the plurality of interconnect lines, respectively, wherein the plurality of terminals are arranged in a direction parallel to a direction in which the plurality of connector terminals are arranged.

Preferably, according to a twelfth aspect of the present invention, in the circuit module of the eleventh aspect, the IC is a memory IC; the plurality of terminals are data pins for inputting and outputting a data signal; the data pins are provided on a first side of the memory IC which is opposed to the connector terminals; the memory IC further includes address/command pins provided on a second side thereof which is opposite from the first side; and the address/command pins receive an address/command signal through a buffer IC provided on the main surface of the board.

In accordance with the first aspect of the present invention, when the circuit module is inserted into the connector, the first and second signal lines separated from each other at the connector are electrically connected to each other through the first and second connector pins, the first and second connector terminals, and the first interconnect line. That is, the first and second connector pins, the first and second connector terminals, and the first interconnect line are regarded as parts of the first and second signal lines. This reduces the stub capacitance in the circuit module.

In accordance with the second aspect of the present invention, the capacitance of the through hole is lower than the capacitance of the first and second connector pins in the case where the first and second signal lines are not separated at the connector. Thus, the stub capacitance of the circuit module of the present invention is lower than that of conventional circuit modules.

In accordance with the third aspect of the present invention, the wiring capacitance of the metal interconnect line is lower than the capacitance of the through hole of the circuit module of the second aspect. Thus, the stub capacitance of the circuit module of the third aspect is lower than that of the circuit module of the second aspect.

In accordance with the fourth aspect of the present invention, when the first and second signal lines are separated from each other at the connector, the circuit module may be inserted into the second connector, if present, which is not to receive the IC module, to provide electrical connection between the first and second signal lines.

In accordance with the fifth aspect of the present invention, the stub capacitance of the circuit module is equal to the stub capacitance of the IC module. Thus, the fifth aspect of the present invention may hold the characteristic impedance of the first and second signal lines constant throughout the main surface of the motherboard, thereby preventing signal reflection resulting from characteristic impedance mismatching.

In accordance with the sixth aspect of the present invention, in the system wherein ICs are mounted on both the first and second main surfaces of the IC module, the signal reflection resulting from the characteristic impedance mismatching is also prevented, as in the circuit module of the fifth aspect of the present invention.

In accordance with the seventh aspect of the present invention, when one system includes the IC module wherein ICs are mounted on both the first and second main surfaces, thereof and the IC module wherein an IC is mounted on one of the first and second main surfaces thereof, the signal reflection resulting from the characteristic impedance mismatching is also prevented, as in the circuit module of the fifth aspect of the present invention.

The eighth aspect of the present invention may decrease the difference in length between the plurality of interconnect lines to accordingly decrease the difference in wiring capacitance between the interconnect lines. This provides the effect of eliminating the need to consider the individual wiring capacitances of the interconnect lines.

In accordance with the ninth aspect of the present invention, all of the IC modules required by the system are inserted into the second connectors positioned between the first connector and the controller. Only the single circuit module inserted into the first connector may avoid disadvantages resulting from the presence of the second connectors which do not receive the IC modules.

In accordance with the tenth aspect of the present invention, the stub capacitance of the IC module to be inserted into the first connector is equal to the stub capacitance of the circuit modules to be inserted into the second connectors. Therefore, the tenth aspect of the present invention may prevent the signal reflection resulting from the characteristic impedance mismatching as well as providing the effects of the circuit module of the ninth aspect.

The eleventh aspect of the present invention may decrease the difference in length between the plurality of interconnect lines, thereby preventing the generation of skews.

In accordance with the twelfth aspect of the present invention, since the data pins are provided on the first side of the memory IC which is opposed to the connector terminals, the length of the interconnect lines for connecting the connector terminals and the data pins is reduced. Furthermore, since the address/command pins provided on the second side of the memory IC which is not opposed to the connector terminals receive the address/command signal through the buffer IC, the load capacitance of the interconnect line for transmitting the address/command signal is reduced.

It is therefore an object of the present invention to provide a circuit module which suppresses a skew resulting from a difference in length between interconnect lines on the circuit module and provides a low stub capacitance to achieve the reduction in power consumption.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
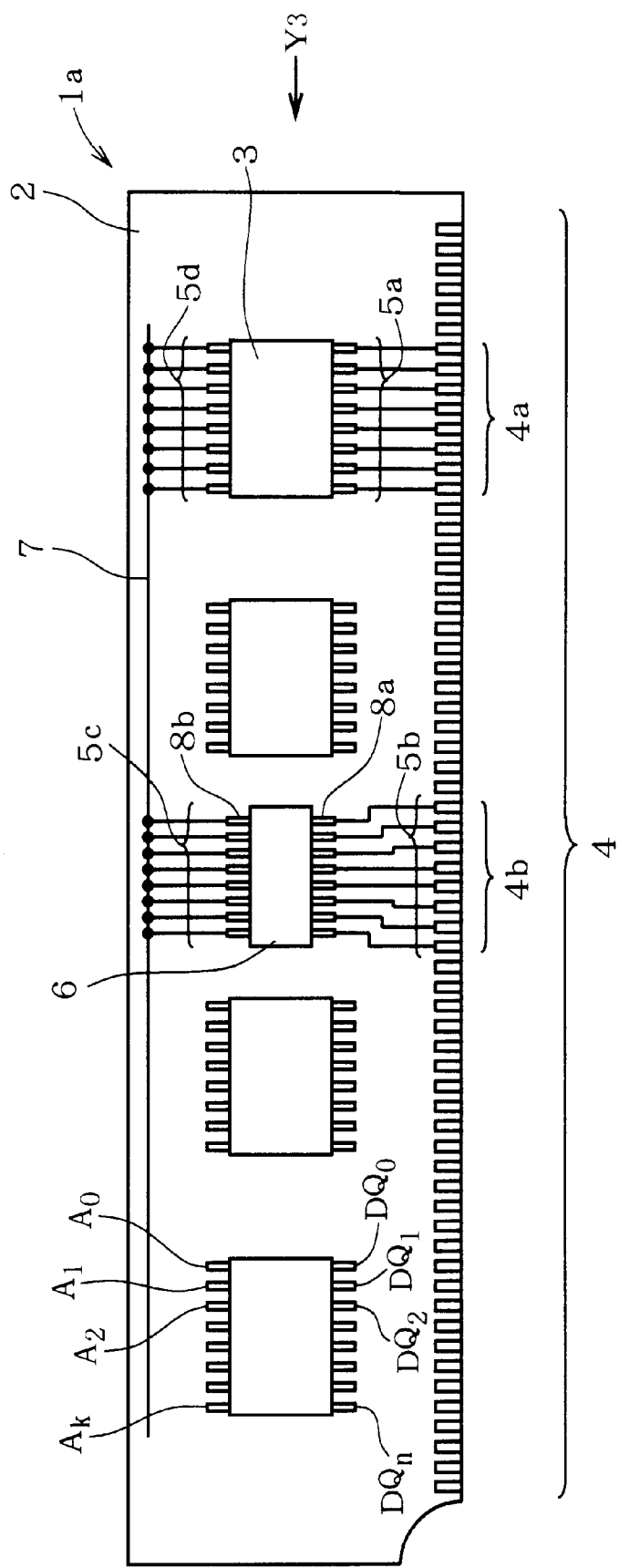
FIG. 1 is a front view of a memory module according to a first preferred embodiment of the present invention.

FIG. 1 is a front view of a memory module 1a according to a first preferred embodiment of the present invention. A plurality, illustrated herein as four, of memory ICs 3 are mounted on a printed wiring board 2. Each of the memory ICs 3 mounted on the surface of the printed wiring board 2 includes pins $DQ_0$ to $DQ_n$ which are data pins for inputting and outputting data signals. The memory module 1a of the first preferred embodiment differs from the conventional memory module 101 in that the direction in which the data pins $DQ_0$ to $DQ_n$ are arranged is parallel to the direction in which connector terminals 4 are arranged. An individual data signal is inputted to and outputted from each data pin $DQ_t$ of each of the memory ICs 3. Thus, when the four memory ICs 3 each having eight data pins are mounted on the printed wiring board 2 as shown in FIG. 1, 32(4×8) connector terminals among the plurality of connector terminals 4 of the memory module 1a function as connector terminals 4a for the data signals. The connector terminals 4a and the data pins $DQ_0$ to $DQ_n$ are connected to each other by interconnect lines 5a provided on the printed wiring board 2. For purposes of simplification, only the connection between the data pins $DQ_0$ to $DQ_n$ of one of the memory ICs 3 which is positioned at the top of the drawing paper (or the rightmost memory IC 3) and the connector terminals 4a is typically shown in FIG. 1.

Each of the memory ICs 3 further includes pins $A_0$ to $A_k$ which are address/command pins for inputting address/command signals to each memory IC 3. In the memory module 1a of the first preferred embodiment, the direction in which the address/command pins $A_0$ to $A_k$ are arranged is also parallel to the direction in which the connector terminals 4 are arranged. Unlike the data signals to be inputted and outputted, an address/command signal is commonly inputted to the address/command pins $A_s$ of the respective memory ICs 3. Thus, when each of the memory ICs 3 includes eight address/command pins as shown in FIG. 1, eight connector terminals among the plurality of connector terminals 4 of the memory module 1a function as connector terminals 4b for the address/command signals.

An interconnect line 5b provided on the printed wiring board 2 is connected at one end thereof to each of the connector terminals 4b, and is connected at the other end thereof to each input pin 8a of a buffer IC 6 mounted on the printed wiring board 2. The buffer IC 6 has output pins 8b connected to a bus 7 through respective interconnect lines 5c. The bus 7 is connected to the address/command pins $A_0$ to $A_k$ through respective interconnect lines 5d. This allows the address/command signals applied to the connector terminals 4b from the exterior to be transmitted in sequential order through the interconnect lines 5b, the buffer IC 6, the interconnect lines 5c, the bus 7, and the interconnect lines 5d to the memory ICs 3. That is, the address/command signals are distributed again between the plurality of memory ICs 3 through the buffer IC 6. It should be noted that the interconnect lines 5c and 5d and the bus 7 are provided on the printed wiring board 2.

Figure 2:
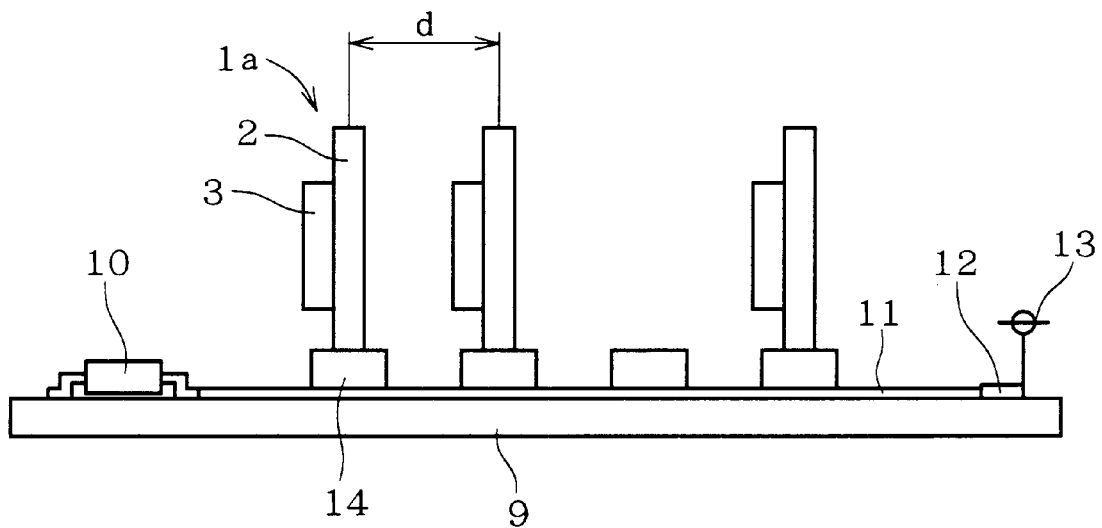
FIG. 2 is a schematic side view showing the general configuration of a system including a plurality of memory modules.

FIG. 2 is a schematic side view showing the general configuration of a system including a plurality of memory modules each corresponding to the memory module 1a. A signal line 11 is provided on a main surface of a motherboard 9. The signal line 11 is connected at one end thereof to a controller 10 disposed on the main surface of the motherboard 9, and is connected at the other end thereof to a terminating resistor 12 provided on the main surface of the motherboard 9. The terminating resistor 12 is connected to a power supply 13 for providing a termination potential. A plurality of connectors 14 arranged at regularly spaced intervals in the longitudinal direction of the signal line 11 are provided also on the main surface of the motherboard 9.

The connectors 14 function to physically support the memory modules 1a inserted therein. The insertion of the plurality of memory modules 1a in the respective connectors 14 provides the arrangement of the plurality of memory modules 1a at regularly spaced intervals d in the longitudinal direction of the signal line 11. Since the signal line 11 extends throughout the main surface of the motherboard 9, the presence of a connector 14 in which no memory module 1a is inserted as shown in FIG. 2 is permitted.

The connectors 14 also function to establish electrical connection between the connector terminals 4 (not shown in FIG. 2) of the memory modules 1a and the signal line 11. Thus, the data signals and address/command signals outputted from the controller 10 are transmitted through the signal line 11 and the connectors 14 to the memory modules 1a.

Figure 3:
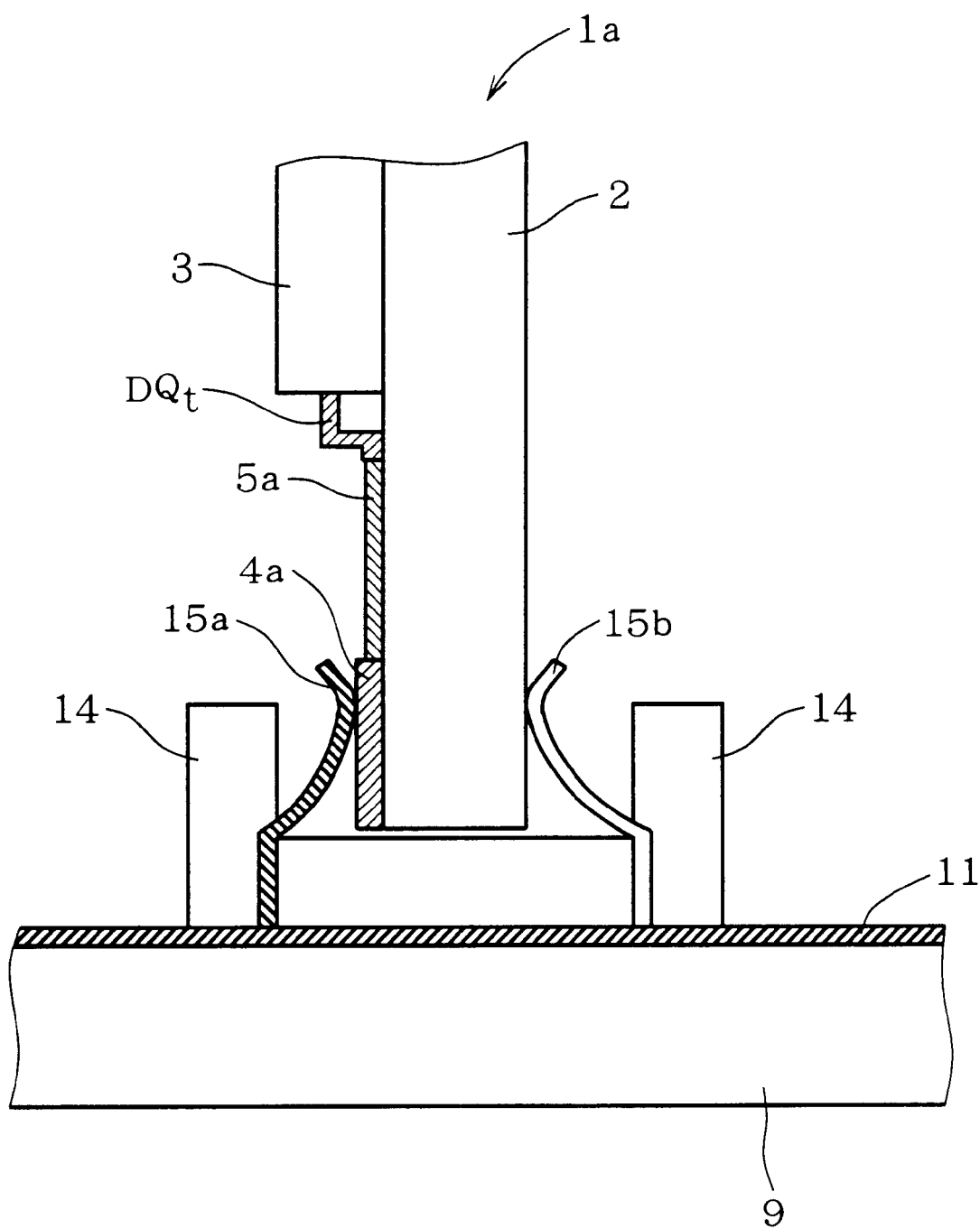
FIG. 3 is a sectional view of the memory module inserted in a connector.

FIG. 3 is a sectional view of the memory module 1a inserted in the connector 14, and particularly shows the memory module 1a in section as viewed in the direction of the arrow $Y_3$ of FIG. 1. The connector 14 includes a connector pin 15b and a conductive connector pin 15a. The connector pins 15a and 15b which are on opposite sides of the memory module 1a hold the memory module 1a therebetween, thereby to support the memory module 1a in the connector 14. Electrical connection between the signal line 11 and the connector terminal 4a is made through the connector pin 15a.

The memory module 1a of the first preferred embodiment provides the following effects with regard to the data signals and the address/command signals. Regarding the data signals, the difference in length between the interconnect lines 5a for connecting the data pins $DQ_0$ to $DQ_n$ and the connector terminals 4a is decreased to suppress the generation of skews. That is, the first preferred embodiment may alleviate the first background art drawback to widely respond to the need for the increase in the signal transfer rate of the memory modules.

Additionally, the memory module 1a of the first preferred embodiment allows the length of the interconnect lines 5a to be much shorter than that of the interconnect lines 105a of the conventional memory module 101 to decrease the wiring capacitance $C_{LF}$ of the connector terminal 4a and the interconnect line 5a in the second background art drawback. Therefore, the first preferred embodiment increases the characteristic impedance $Z_1$ of the signal line 11 given by Equation (2) to increase the resistance of the terminating resistor 12, achieving the reduction in power consumption.

The effects of the first preferred embodiment with regard to the address/command signals are as follows. In the conventional memory module 101, the input capacitance of all memory ICs 103 mounted on the printed wiring board 102 must be taken into consideration as the input capacitance $C_{IN}$ to determine the characteristic impedance $Z_1$ of the signal line 111, and as a result the characteristic impedance $Z_1$ of the signal line 111 has been low. In the memory module 1a of the first preferred embodiment, on the other hand, only the input capacitance of the buffer IC 6 is required to be taken into consideration. Thus, the characteristic impedance $Z_1$ of the signal line 11 is increased. Furthermore, the memory module 1a of the first preferred embodiment may include the interconnect lines 5b having a length less than that of the interconnect lines 105b of the conventional memory module 101. Therefore, the first preferred embodiment may increase the resistance of the terminating resistor 12, achieving the reduction in power consumption.

Further, positioning the buffer IC 6 so that the length of the interconnect lines 5a is approximately equal to the length of the interconnect lines 5b permits the resistance of the terminating resistor 12 for the signal line 11 for transmitting the address/command signals to be substantially the same as the resistance of the terminating resistor 12 for the signal line 11 for transmitting the data signals.

Second Preferred Embodiment

Figure 4:
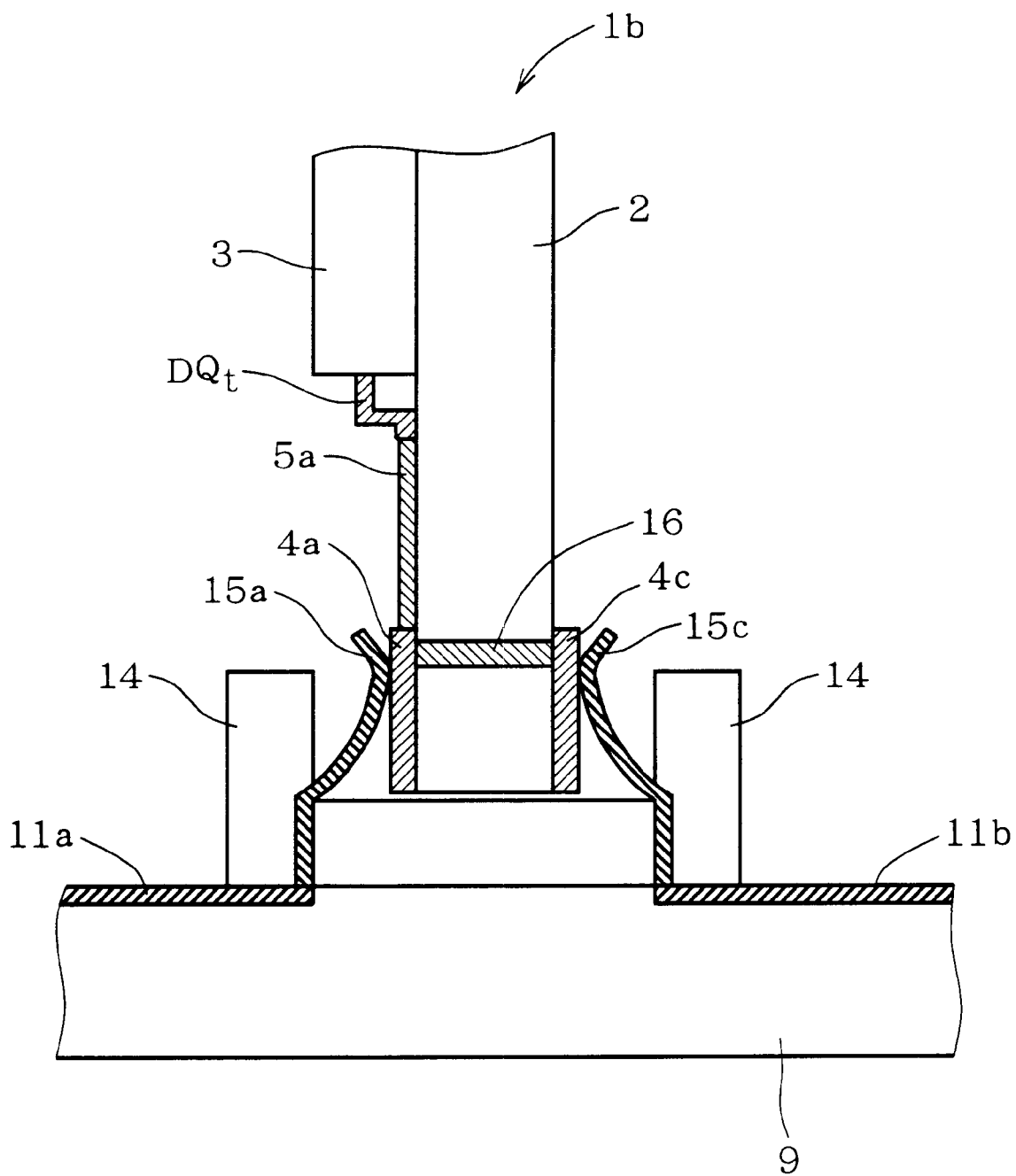
FIG. 4 is a sectional view of another form of the memory module inserted in the connector according to a second preferred embodiment of the present invention.

FIG. 4 is a sectional view of a memory module 1b inserted in the connector 14 according to a second preferred embodiment of the present invention. A conductive connector terminal 4c corresponding to the connector terminal 4a provided on the front surface of the printed wiring board 2 is provided on the back surface of the printed wiring board 2. A through hole 16 is formed selectively extending between part of the front surface of the printed wiring board 2 where the connector terminal 4a is formed and part of the back surface thereof where the connector terminal 4c is formed, and is filled with a conductor. Then, the conductor which fills the through hole 16 establishes electrical connection between the connector terminal 4a and the connector terminal 4c.

Signal lines 11a and 11b separated at the connector 14 are provided on the main surface of the motherboard 9. The conductive connector pin 15a provides electrical connection between the connector terminal 4a and the signal line 11a, and the conductive connector pin 15c provides electrical connection between the connect Dr terminal 4c and the signal line 11b.

Figure 5:
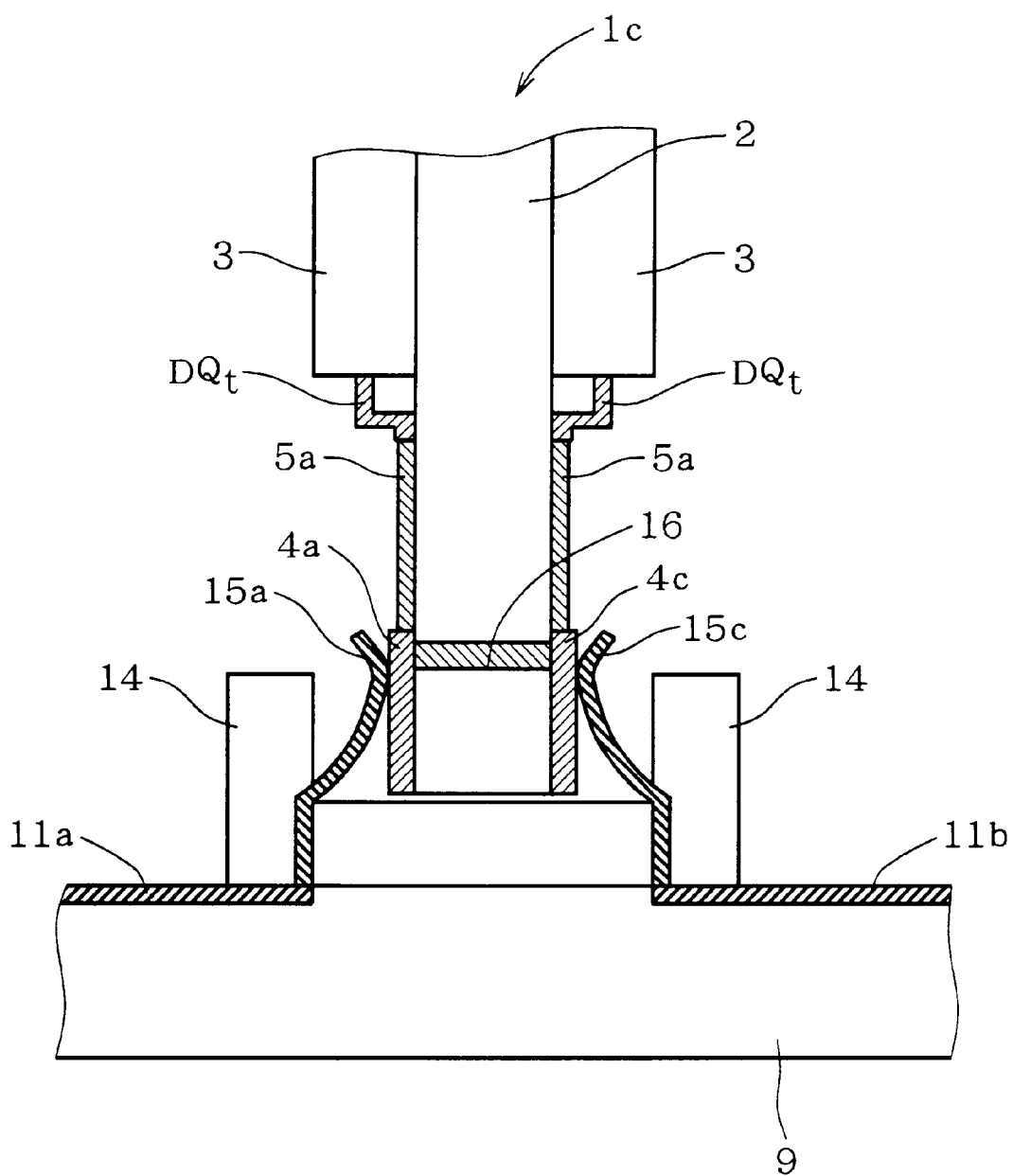
FIG. 5 is a sectional view of another form of the memory module inserted in the connector according to the second preferred embodiment of the present invention.

Although the memory module wherein the memory ICs 3 are mounted only on the front surface of the printed wiring board 2 has been described hereinabove, the second preferred embodiment of the present invention is similarly applicable to a memory module wherein the memory ICs 3 are mounted on both the front and back surfaces of the printed wiring board 2. FIG. 5 is a sectional view of a memory module 1c including the memory ICs 3 mounted on the front and back surfaces of the printed wiring board 2, with the connector 14 receiving the memory module 1c. The data pin $DQ_t$ of the memory IC 3 mounted on the back surface of the printed wiring board 2 is connected through the interconnect line 5a to the connector terminal 4c.

As described above, in the memory modules 1b and 1c of the second preferred embodiment, the connector terminals 4a and 4c are electrically connected to each other by the conductor which fills the through hole 16 selectively extending between the front and back surfaces of the printed wiring board 2. The insertion of the memory modules 1b and 1c having the through hole 16 in the connector 14 enables electrical connection between the signal lines 11a and 11b which are separated at the connector 14. In such a structure, the connector pins 15a and 15c, the connector terminals 4a and 4c, and the conductor which fills the through hole 16 may be regarded as parts of the signal line 11 of the first preferred embodiment. Thus, only the interconnect lines 5a provided on the printed wiring board 2 serve as the stubs for the signal lines 11a and 11b.

While a stub capacitance $C_{S0}$ in the conventional memory module 101 is given by $C_{S0}=C_C+C_{LF}+C_{IN}$, a stub capacitance $C_{S1}$ in the memory module 1b of the second preferred embodiment is $C_{S1}=C_{TH}+C_{LF}+C_{IN}$ where $C_{TH}$ is the capacitance of the through hole 16. Therefore, a characteristic impedance $Z_2$ of the signal lines 11a and 11b in this case is given by $$Z_2 = \sqrt{\frac{L \cdot d}{C \cdot d + C_{TH} + C_{LF} + C_{IN}}} \quad (3)$$

It will be found from a comparison between Equations (2) and (3) that the relationship $Z_2 >> Z_1$ holds since $C_C >> C_{TH}$ in general. Specifically, the memory module 1b of the second preferred embodiment has the stub capacitance which is much lower than that of the conventional memory module 101, thereby providing a higher characteristic impedance of the signal lines 11a and 11b. Therefore, the second preferred embodiment may increase the resistance of the terminating resistor 12 provided on the main surface of the motherboard 9, achieving further reduction in power consumption, as compared with the memory module 1a of the first preferred embodiment.

Third Preferred Embodiment

Figure 6:
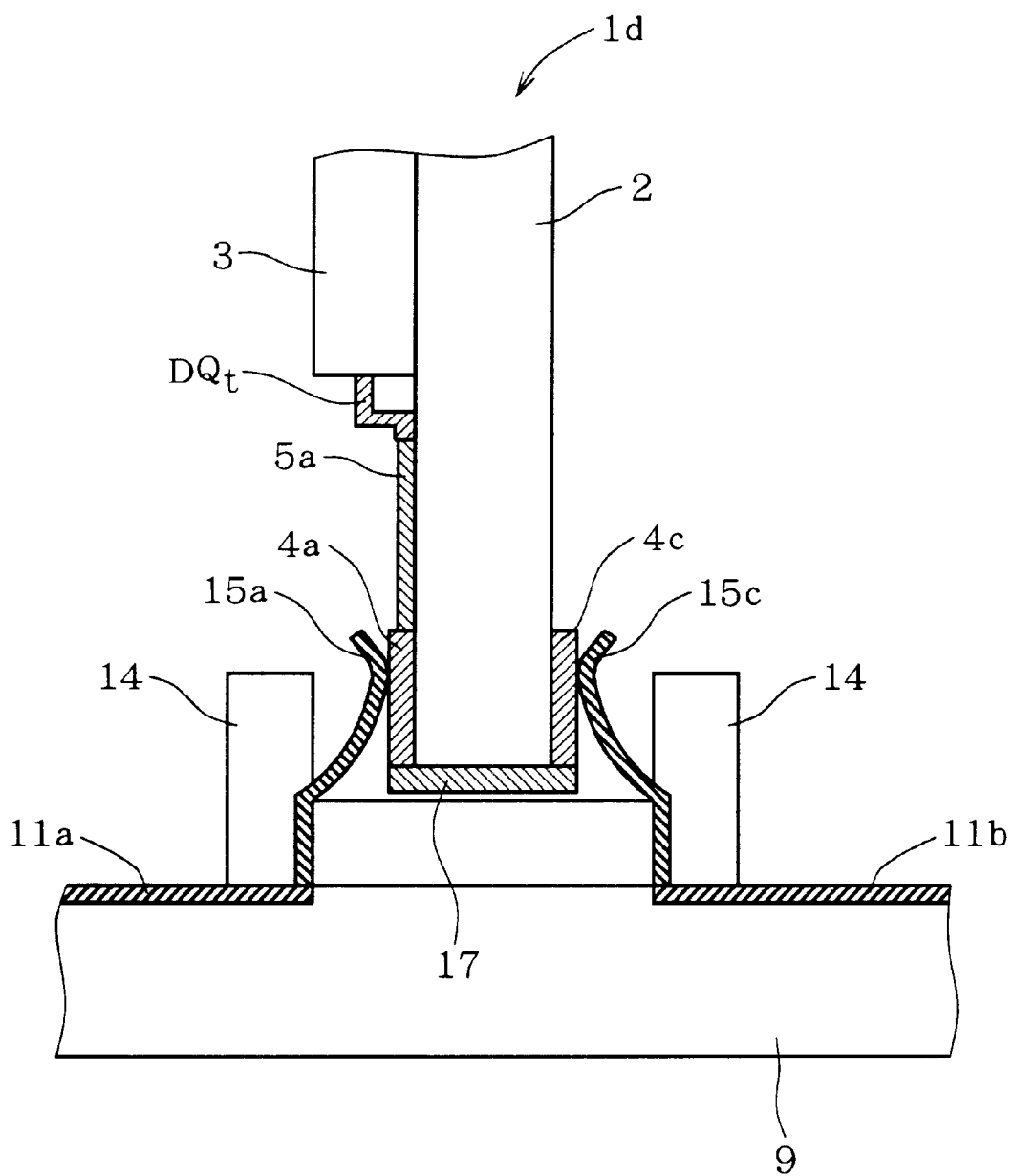
FIG. 6 is a sectional view of another form of the memory module inserted in the connector according to a third preferred embodiment of the present invention.

FIG. 6 is a sectional view of a memory module 1d inserted in the connector 14 according to a third preferred embodiment of the present invention. In the memory module 1c of the second preferred embodiment, the electrical connection between the connector terminal 4a and the connector terminal 4c is made through the conductor which fills the through hole 16. On the other hand, in the memory module 1d of the third preferred embodiment, a metal interconnect line 17 in contact with both the connector terminals 4a and 4c is provided on a side surface of the printed wiring board 2 to establish electrical connection between the connector terminals 4a and 4c therethrough.

Figure 7:
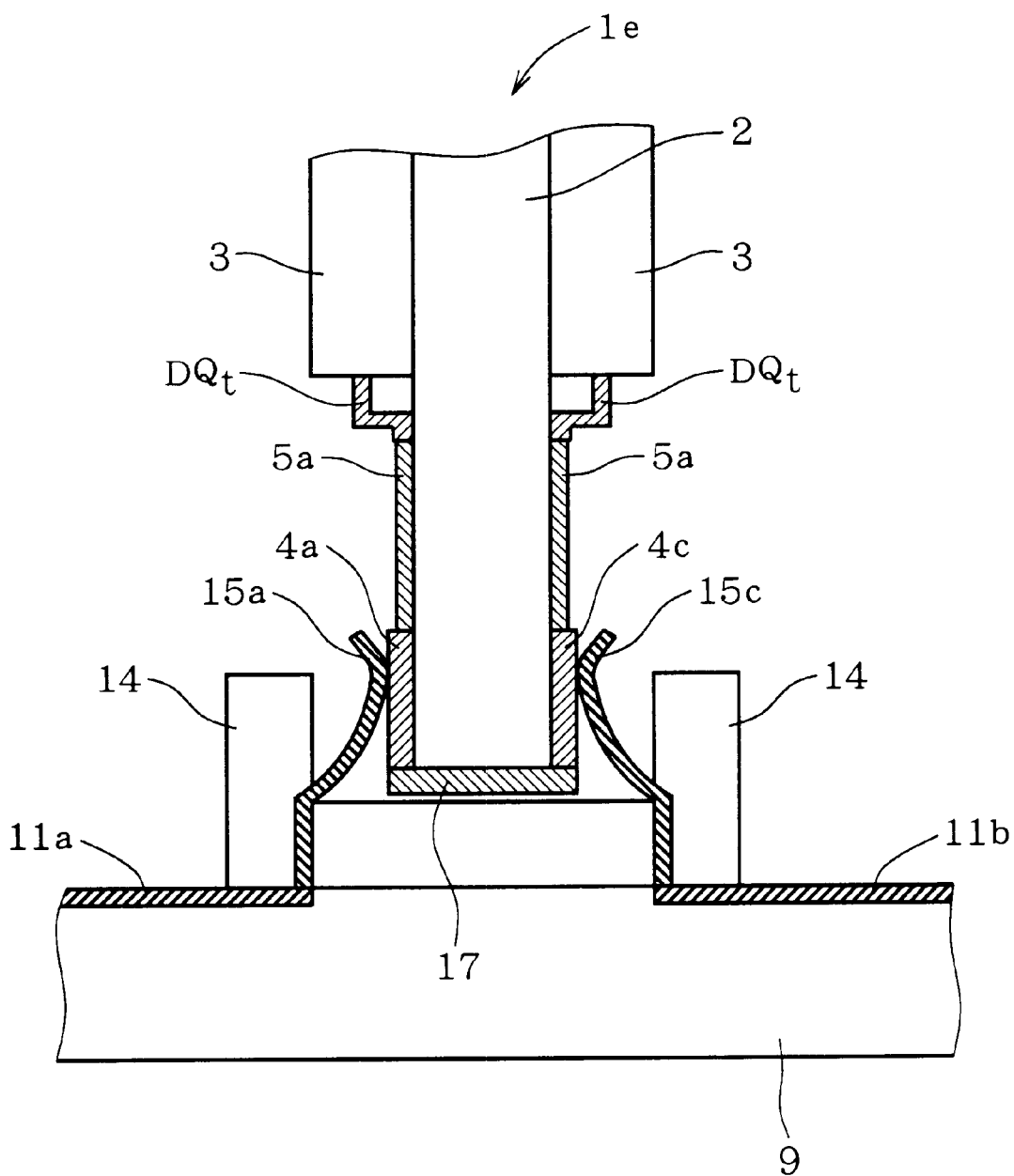
FIG. 7 is a sectional view of another form of the memory module inserted in the connector according to the third preferred embodiment of the present invention.

Although the memory module wherein the memory ICs 3 are mounted only on the front surface of the printed wiring board 2 has been described hereinabove, the memory ICs 3 may be mounted on both the front and back surfaces of the printed wiring board 2. FIG. 7 is a sectional view of a memory module 1e including the memory ICs 3 mounted on the front and back surfaces of the printed wiring board 2, with the connector 14 receiving the memory module 1e. The data pin $DQ_t$ of the memory IC 3 mounted on the back surface of the printed wiring board 2 is connected through the interconnect line 5a to the connector terminal 4c.

As described above, in the memory modules 1d and 1e of the third preferred embodiment, the connector terminals 4a and 4c are electrically connected to each other through the metal interconnect line 17. The wiring capacitance of the metal interconnect line 17 is sufficiently lower than the capacitance of the through hole 16. Therefore, the use of the memory modules 1d and 1e of the third preferred embodiment provides a higher characteristic impedance of the signal lines 11a and 11b than the use of the memory module 1b of the second preferred embodiment. Consequently, the third preferred embodiment may increase the resistance of the terminating resistor 12, achieving further reduction in power consumption.

Fourth Preferred Embodiment

In the second and third preferred embodiments, the signal lines 11a and 11b separated at the connector 14 are provided on the main surface of the motherboard 9 and are electrically connected to each other through the conductor which fills the through hole 16 or the metal interconnect line 17. Thus, the memory modules must be inserted in all of the connectors 14 for proper operation of a system including the plurality of memory modules. In practice, however, it is common that some of the connectors 14 are left, with no memory modules inserted therein, depending on the performance or costs required by the system. It is hence desirable to satisfy such an arrangement when the memory modules of the second and third preferred embodiments are used.

Figure 8:
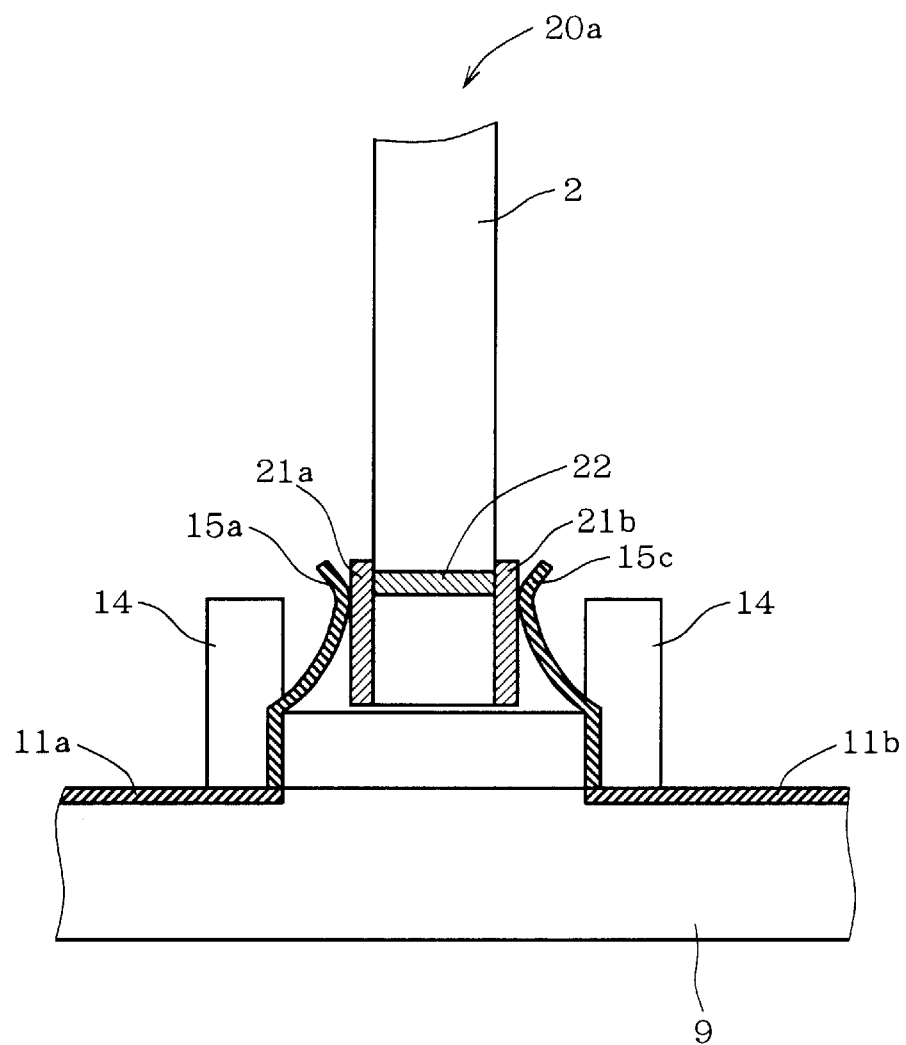
FIG. 8 is a sectional view of a module inserted in the connector according to a fourth preferred embodiment of the present invention.

FIG. 8 is a sectional view of a module 20a inserted in the connector 14 according to a fourth preferred embodiment of the present invention. A conductive connector terminal 21a is provided on the front surface of the printed wiring board 2, and a conductive connector terminal 21b corresponding to the conductive connector terminal 21a is provided on the back surface of the printed wiring board 2. A through hole 22 is formed selectively extending between part of the front surface of the printed wiring board 2 where the connector terminal 21a is formed and part of the back surface thereof where the connector terminal 21b is formed, and is filled with a conductor. Then, the conductor which fills the through hole 22 establishes electrical connection between the connector terminal 21a and the connector terminal 21b.

As illustrated in FIG. 8, the connector terminal 21a is electrically connected to the signal line 11a through the conductive connector pin 15a, and the connector terminal 21b is electrically connected to the signal line 11b through the conductive connector pin 15c.

Thus, the data signal and the address/command signal are transmitted from the signal line 11a in sequential order through the connector pin 15a, the connector terminal 21a, the conductor which fills the through hole 22, the connector terminal 21b, and the connector pin 15c to the signal line 11b.

Figure 9:
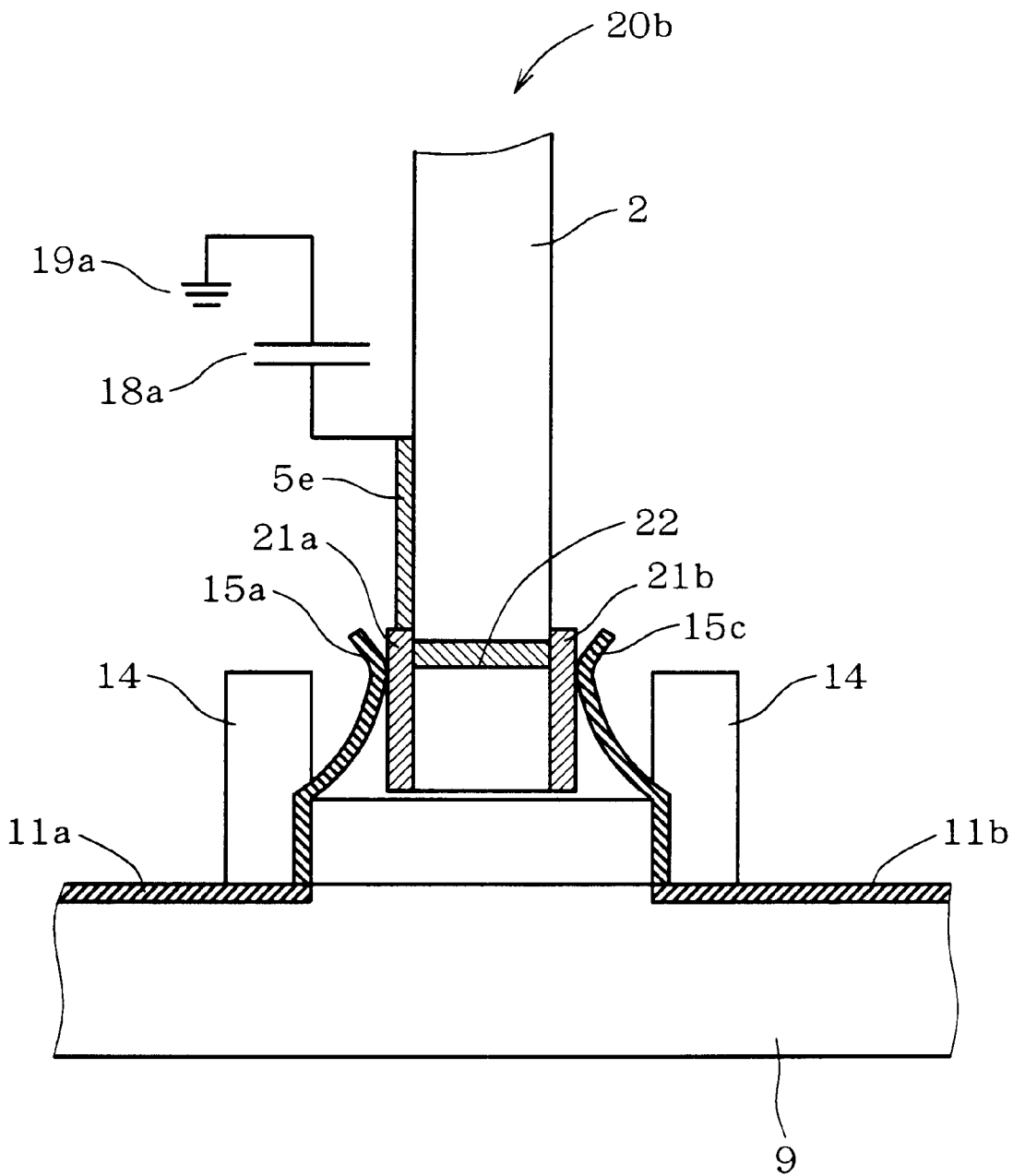
FIG. 9 is a schematic sectional view of another form of the module inserted in the connector according to the fourth preferred embodiment of the present invention.

FIG. 9 is a schematic sectional view of a module 20b provided by making improvements to the module 20a, with the connector 14 receiving the module 20b. An interconnect line 5e is provided on the front surface of the printed wiring board 2. The interconnect line 5e is connected at one end thereof to the connector terminal 21a, and is connected at the other end thereof to one end of a capacitor 18a. The other end of the capacitor 18a is connected to a ground 19a.

Figure 10:
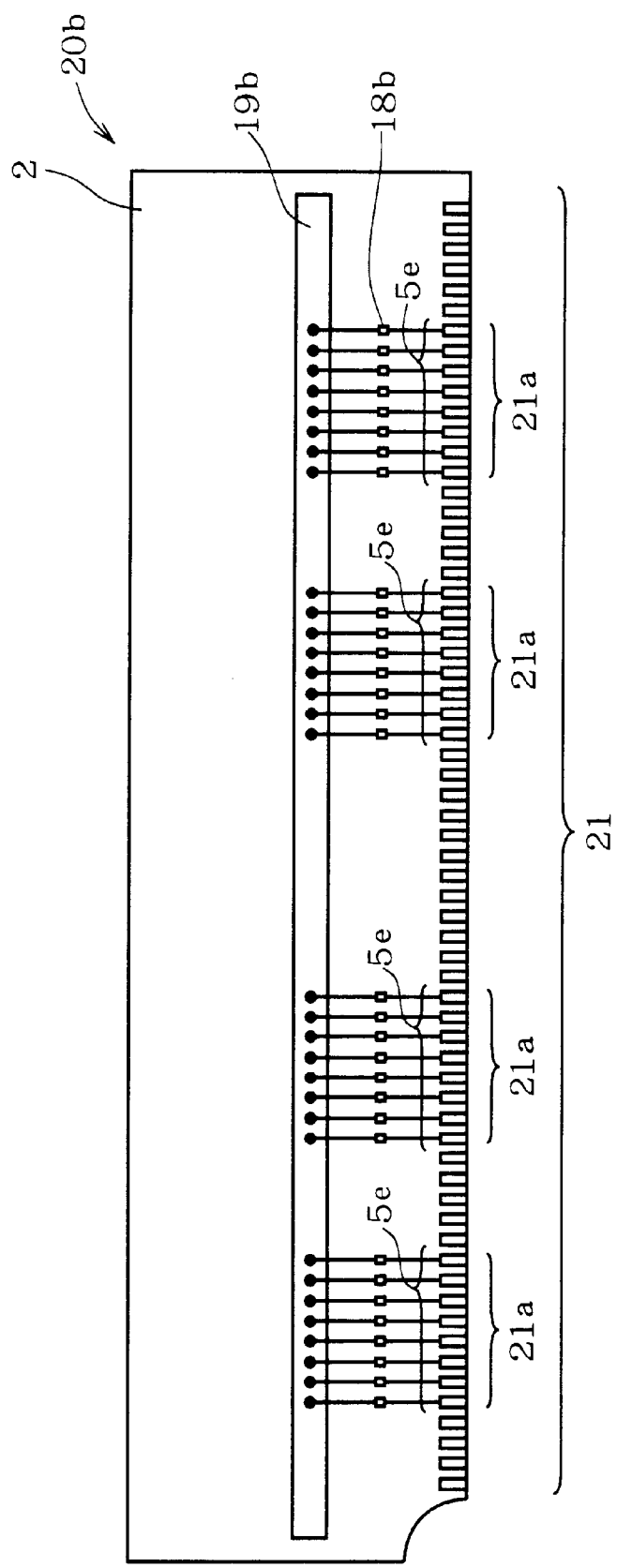
FIG. 10 is a plan view showing a particular structure of the module of FIG. 9.

FIG. 10 is a plan view showing a particular structure of the module 20b. The module 20b is provided with a plurality of connector terminals 21. Some of the connector terminals 21 which are connected through the connector pin 15a to the signal line 11a for transmitting the data signal function as the connector terminals 21a. The connector terminals 21a are connected through the interconnect lines 5e to chip capacitors 18b, respectively. The chip capacitors 18b are provided on the front surface of the printed wiring board 2, and correspond to the capacitor 18a shown in FIG. 9. The chip capacitors 18b are also connected to a film 19b for providing a ground potential. The film 19b is provided on the front surface of the printed wiring board 2, and corresponds to the ground 19a shown in FIG. 9.

With reference to FIGS. 9 and 10, a characteristic impedance $Z_3$ of the signal lines 11a and 11b is given by $$Z_3 = \sqrt{\frac{L \cdot d}{C \cdot d + C_{TH} + C_{LF1} + EC}} \quad (4)$$

where $C_{LF1}$ is the wiring capacitance of the interconnect line 5e, and EC is the capacitance of the chip capacitor 18b, or the capacitance of the capacitor 18a.

In the memory module 1b shown in FIG. 3, the characteristic impedance $Z_2$ of the signal lines 11a and 11b is given by Equation (3). It will be found from a comparison between Equations (3) and (4) that the relationship $Z_2=Z_3$ holds if $C_{LF}=C_{LF1}$ and $C_{IN}=EC$. That is, the characteristic impedance of the signal lines 11a and 11b when the memory module 1b is inserted in the connector 14 is equal to the characteristic impedance of the signal lines 11a and 11b when the module 20b is inserted in the connector 14. The relationship $C_{LF}=C_{LF1}$ is satisfied if the length of the interconnect line 5a is equal to the length of the interconnect line 5e. The relationship $C_{IN}=EC$ is satisfied by appropriately selecting the chip capacitor 18b which satisfies this condition. Alternatively, an IC including a circuit having the input capacitance $C_{IN}$ may be mounted on the front surface of the printed wiring board 2 in place of providing the chip capacitors 18b.

The above description with reference to FIGS. 9 and 10 is based on the assumption that the system employs the memory module 1b wherein the memory ICs 3 are mounted on only the front surface of the printed wiring board 2. However, if it is assumed that the system employs the memory module 1c wherein the memory ICs 3 are mounted on the front and back surfaces of the printed wiring board 2, the insertion of the module 20b in the connector 14 which is not to receive the memory module 1c does not enable the attainment of the intention of making the characteristic impedance of the signal lines 11a and 11b when the memory module 1c is inserted in the connector 14 equal to the characteristic impedance of the signal lines 11a and 11b when the module 20b is inserted in the connector 14. This is because the stub capacitance $C_{TH}+C_{LF}+C_{IN}$ of the module 20b is not equal to the stub capacitance $C_{TH}+2C_{LF}+2C_{IN}$ of the memory module 1c. Description is given hereinafter on the structure of a module which is capable of attaining the intention also if it is assumed that the system employs the memory module 1c.

Figure 11:
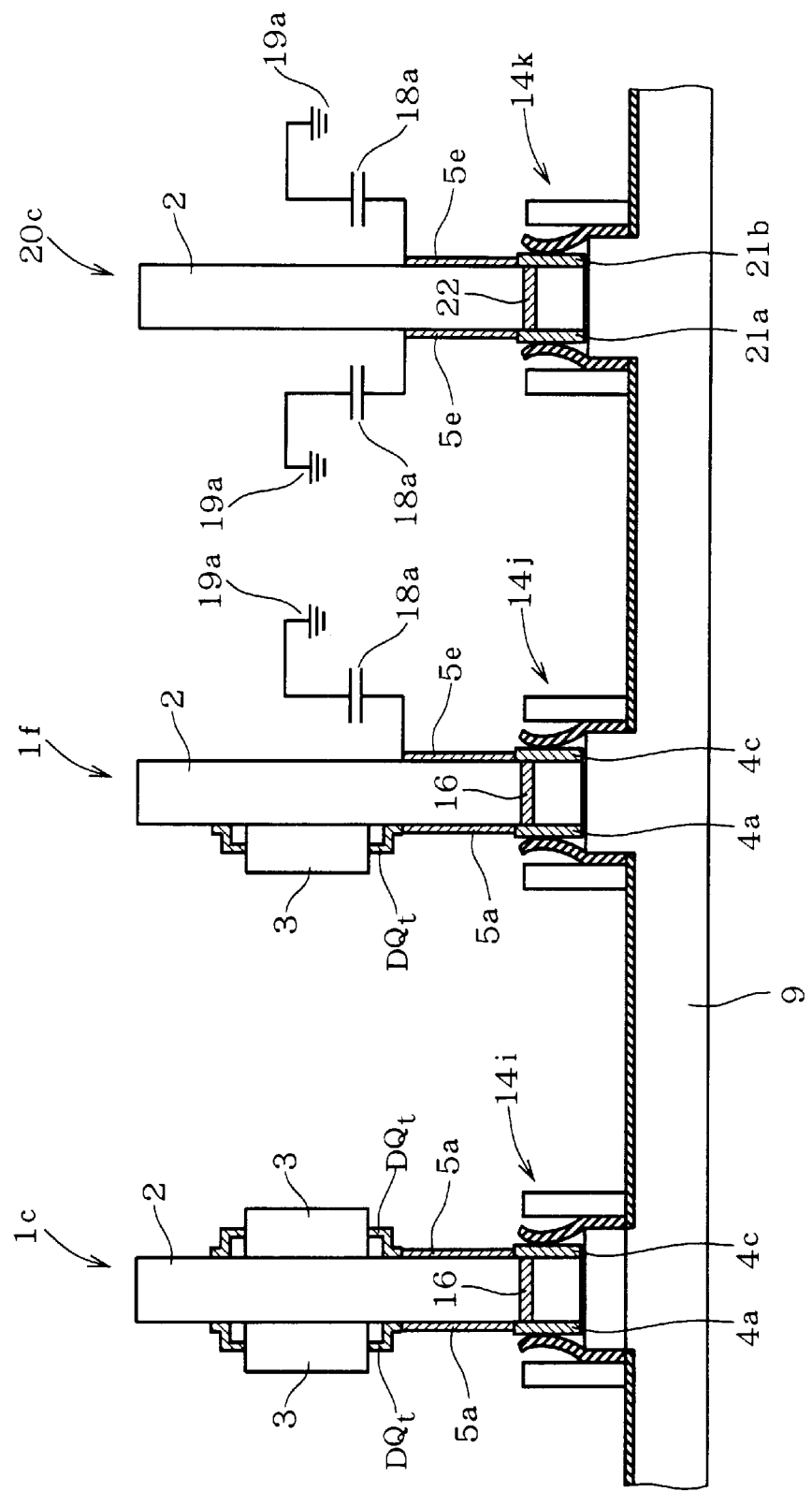
FIG. 11 is a sectional view partially showing the configuration of a system employing the memory module of FIG. 5.

FIG. 11 is a sectional view partially showing the configuration of the system which employs the memory module 1c. Connectors 14i to 14k are provided on the main surface of the motherboard 9. The connector 14i is a connector that is to receive the memory module 1c, and the connector 14k is a connector that is not to receive the memory module 1c. A module 20c is inserted in the connector 14k. The module 20c is basically similar in construction to the module 20b, but differs from the module 20b in that the interconnect line 5e, the capacitance 18a and the ground 19a which are similar to those on the front surface of the printed wiring board 2 are provided also on the back surface thereof. The particular construction on the back surface of the module 20c is similar to that shown in FIG. 10. The provision of the interconnect line 5e and the capacitance 18a also on the back surface of the printed wiring board 2 causes the module 20c to provide the stub capacitance $C_{TH}+2C_{LF}+2C_{IN}$ which is equal to the stub capacitance of the memory module 1c.

The system employing the memory module 1c is required to permit the use of the memory module 1b wherein the memory ICs 3 are mounted on only the front surface of the printed wiring board 2. However, the memory module 1b provides the stub capacitance $C_{TH}+C_{LF}+C_{IN}$ which is different from the stub capacitance of the memory module 1c and the stub capacitance of the module 20c. Thus, the use of the memory module 1b as it is fails to maintain the characteristic impedance of the signal lines 11a and 11b constant throughout the main surface of the motherboard 9. In FIG. 11, there is shown a memory module 1f improved to avoid such a disadvantage. The memory module 1f includes a memory IC 3 mounted on the front surface of the printed wiring board 2, and the interconnect line 5e, the capacitance 18a and the ground 19a which are provided on the back surface thereof. The provision of the interconnect line 5e and the capacitance 18e on the back surface of the printed wiring board 2 causes the memory module 1f to provide the stub capacitance $C_{TH}+2C_{LF}+2C_{IN}$ which is equal to the stub capacitances of the memory module 1c and the module 20c.

In accordance with the modules 20a to 20c of the fourth preferred embodiment, the insertion of the modules 20a to 20c in the connectors 14 which are not to receive the modules 1b and 1c may provide electrical connection between the signal lines 11a and 11b separated at the connector 14 through the modules 20a to 20c.

Further, in accordance with the module 20b of the fourth preferred embodiment, the insertion of the module 20b in the connector 14 which is not to receive the memory module 1b in the system employing the memory module 1b wherein the memory ICs 3 are mounted on only the front surface of the printed wiring board 2 allows the characteristic impedance of the signal lines 11a and 11b to be held constant throughout the main surface of the motherboard 9, preventing data signal reflection resulting from characteristic impedance mismatching.

Furthermore, in accordance with the module 20c of the fourth preferred embodiment, the insertion of the module 20c in the connector 14k which is not to receive the memory module 1c in the system employing the memory module 1c wherein the memory ICs 3 are mounted on the front and back surfaces of the printed wiring board 2 allows the characteristic impedance of the signal lines 11a and 11b to be held constant throughout the main surface of the motherboard 9, preventing the data signal reflection resulting from the characteristic impedance mismatching.

Further, in accordance with the memory module 1f of the fourth preferred embodiment, the use of the memory module 1f in the system employing the memory module 1c wherein the memory ICs 3 are mounted on the front and back surfaces of the printed wiring board 2 allows the use of the memory module 1b wherein the memory ICs 3 are mounted on only the front surface of the printed wiring board 2 while preventing the data signal reflection.

Although the connector terminals 21a and 21b are electrically connected to each other through the conductor which fills the through hole 22 in the above description, the metal interconnect line 17 provided on the side surface of the printed wiring board 2 as illustrated in the third preferred embodiment may be used to electrically connect the connector terminals 21a and 21b to each other, thereby providing similar effects.

Fifth Preferred Embodiment

It has been described in the fourth preferred embodiment that the insertion of the module 20b in the connector 14 which is not to receive the memory module 1b enables the electrical connection between the signal lines 11a and 11b, with the data signal reflection prevented. A fifth preferred embodiment according to the present invention relates to another structure for avoiding the adverse effect caused by the non-insertion of the memory module 1b in the connector 14, that is, such a disadvantage that the signal lines 11a and 11b are not electrically connected.

Figure 12:
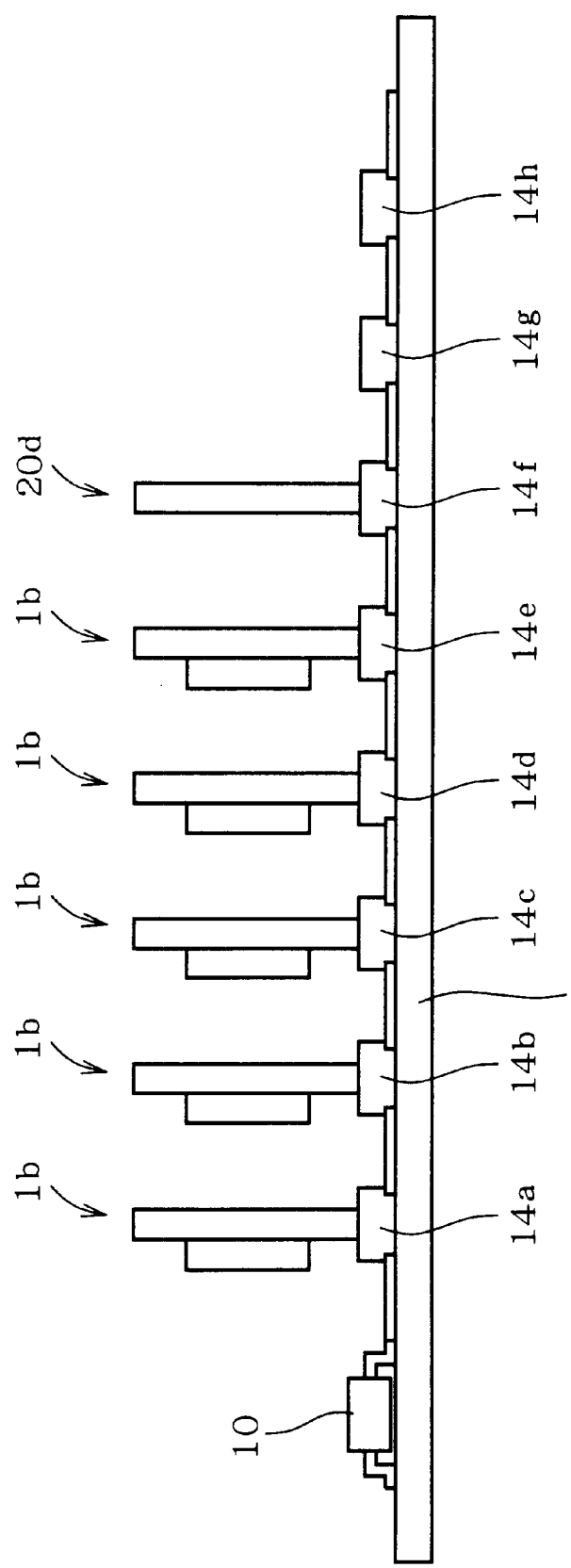
FIG. 12 is a schematic side view showing the general configuration of a system including a plurality of memory modules of FIG. 4.

FIG. 12 is a schematic side view showing the general configuration of the system including a plurality of memory modules each corresponding to the memory module 1b. The controller 10 and connectors 14a to 14h are provided on the main surface of the motherboard 9. The connectors 14a to 14h receive the memory modules 1b in order of increasing distance from the controller 10, that is, in order starting at the connector 14a. A module 20d is inserted into the next connector (the connector 14f in FIG. 12) after the connector (the connector 14e in FIG. 12) which receives the last memory module 1b.

Figure 13:
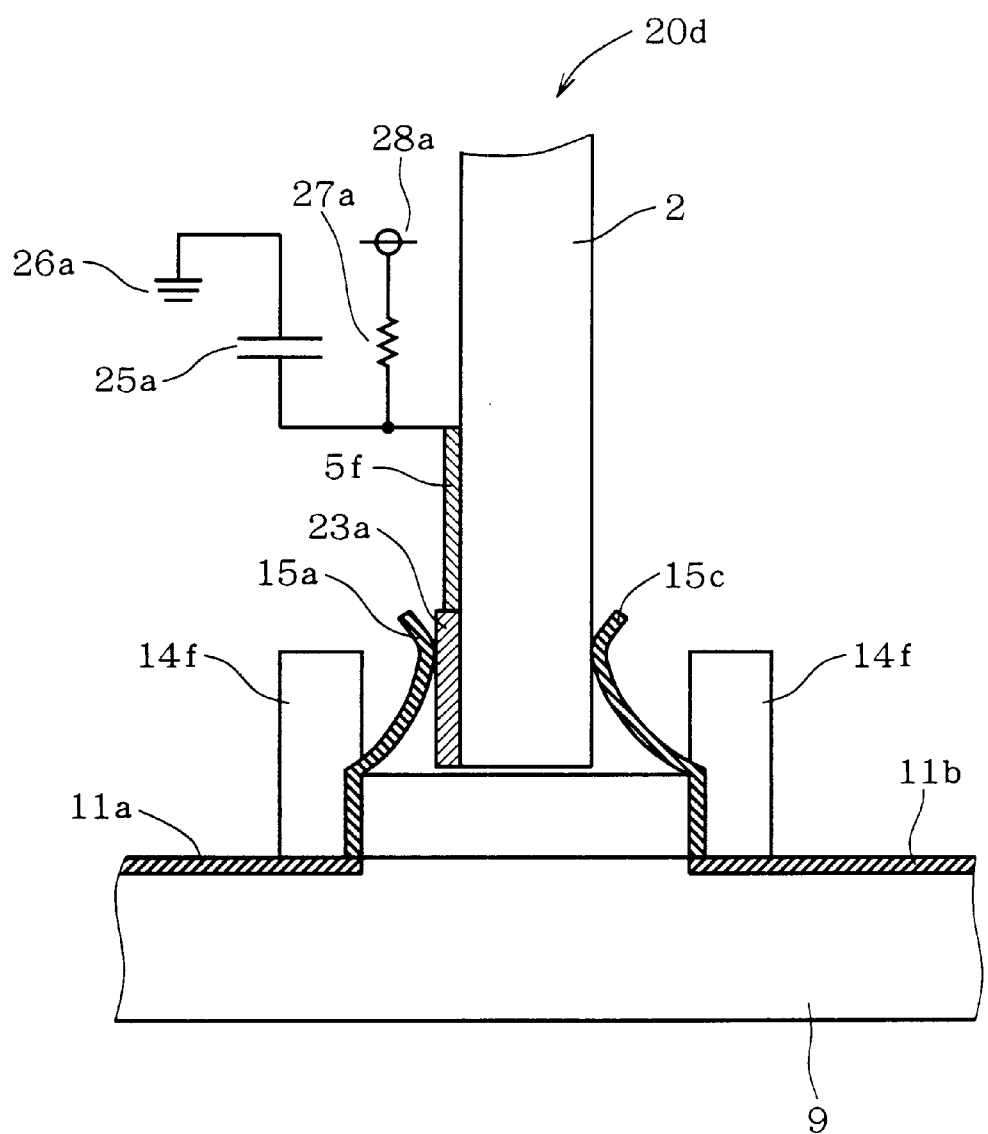
FIG. 13 is a schematic sectional view of another form of the module inserted in a connector according to a fifth preferred embodiment of the present invention.

FIG. 13 is a schematic sectional view of the module 20d inserted in the connector 14f according to the fifth preferred embodiment of the present invention. A connector terminal 23a and an interconnect line 5f are provided on the front surface of the printed wiring board 2 of the module 20d. The interconnect line 5f is connected at one end thereof to the connector terminal 23a, and is connected at the other end thereof commonly to a capacitor 25a connected to a ground 26a and a terminating resistor 27a connected to a power supply 28a. The power supply 28a provides a termination potential and corresponds to the power supply 13 of FIG. 2. The terminating resistor 27a corresponds to the terminating resistor 12 of FIG. 2. The connector terminal 23a is connected to the signal line 11a through the connector pin 15a.

Figure 14:
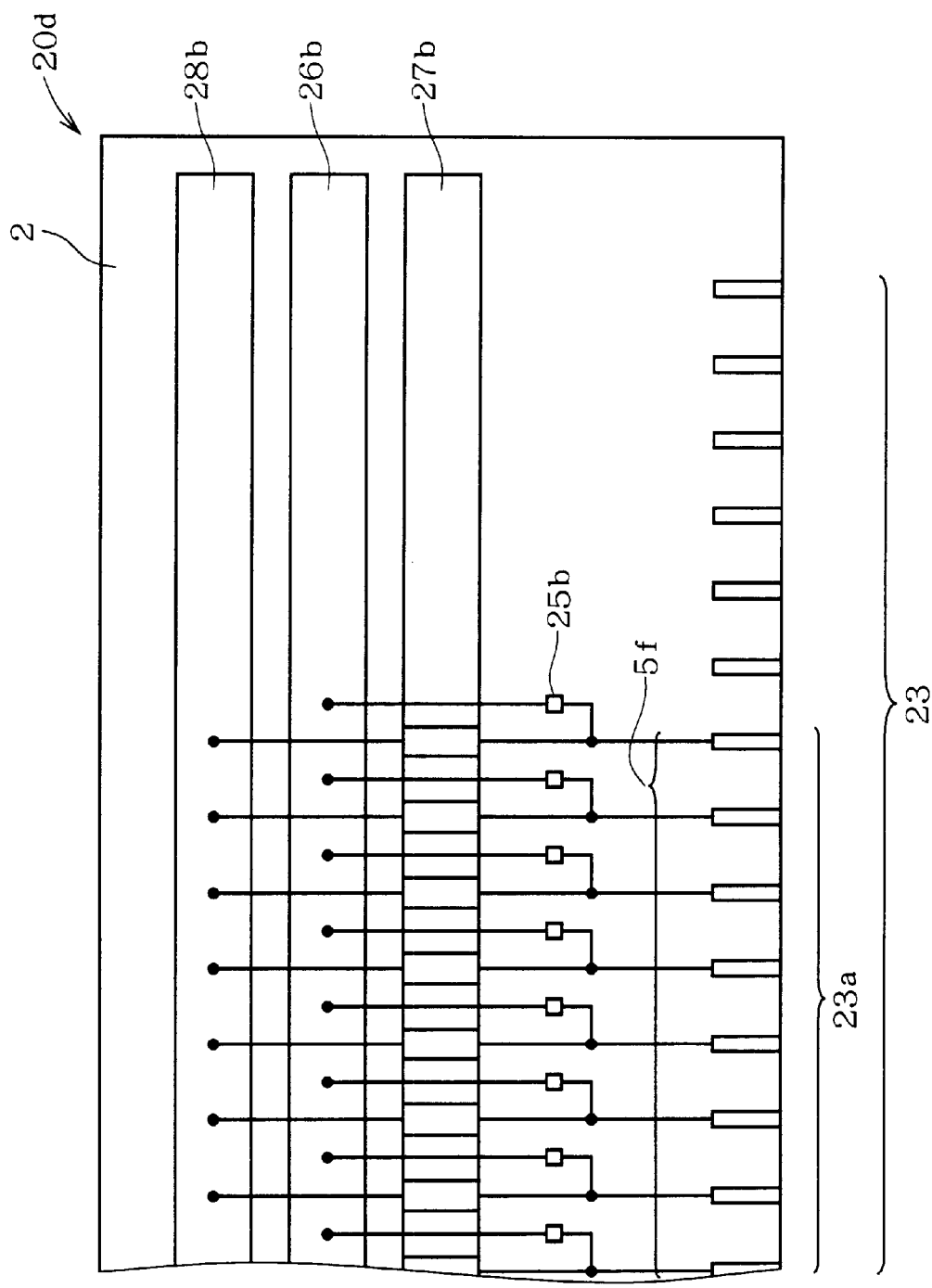
FIG. 14 is a plan view partially showing a particular structure of the module of FIG. 13.

FIG. 14 is a plan view partially showing a particular structure of the module 20d. A plurality of connector terminals 23 are provided on the front surface of the module 20d. Some of the connector terminals 23 which are to be connected through the connector pin 15a to the signal line 11a for transmitting the data signal function as the connector terminals 23a. The connector terminals 23a are connected through the interconnect lines 5f to chip capacitors 25b, respectively. The chip capacitors 25b are provided on the front surface of the printed wiring board 2, and correspond to the capacitor 25a shown in FIG. 13. The chip capacitors 25b are connected to a film 26b for providing a ground potential. The film 26b is provided on the front surface of the printed wiring board 2, and corresponds to the ground 26a shown in FIG. 13. The connector terminals 23a are connected through the interconnect lines 5f also to a film resistor 27b. The film resistor 27b is provided on the front surface of the printed wiring board 2, and corresponds to the terminating resistor 27a shown in FIG. 13. The film resistor 27b is also connected to a film 28b for providing a termination potential. The film 28b is provided on the front surface of the printed wiring board 2, and corresponds to the power supply 28a shown in FIG. 13. As described in the fourth preferred embodiment, in order to make the stub capacitance of the memory module 1b equal to the stub capacitance of the module 20d, the length of the interconnect lines 5f should equal the length of the interconnect lines 5a, and the capacitance of the chip capacitors 25b should equal the input capacitance of the memory ICs 3.

The above description is based on the assumption that the system employs the memory module 1b in which the memory ICs 3 are mounted on only the front surface of the printed wiring board 2. Description will be given based on the assumption that the system employs the memory module 1c in which the memory ICs 3 are mounted on the front and back surfaces of the printed wiring board 2.

Figure 15:
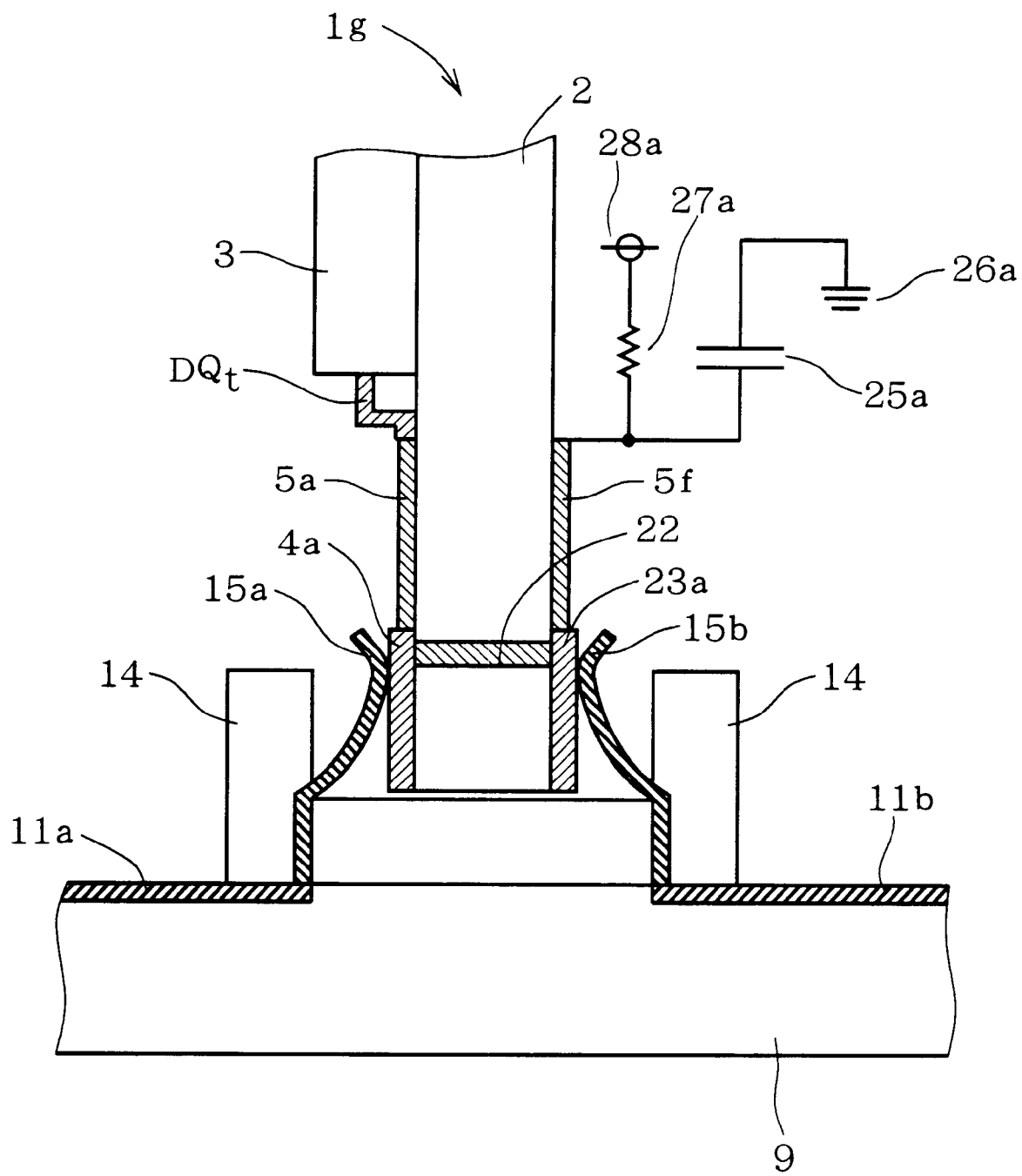
FIG. 15 is a sectional view of another form of the memory module inserted in the connector shown in FIG. 12 according to the fifth preferred embodiment of the present invention.
Figure 16:
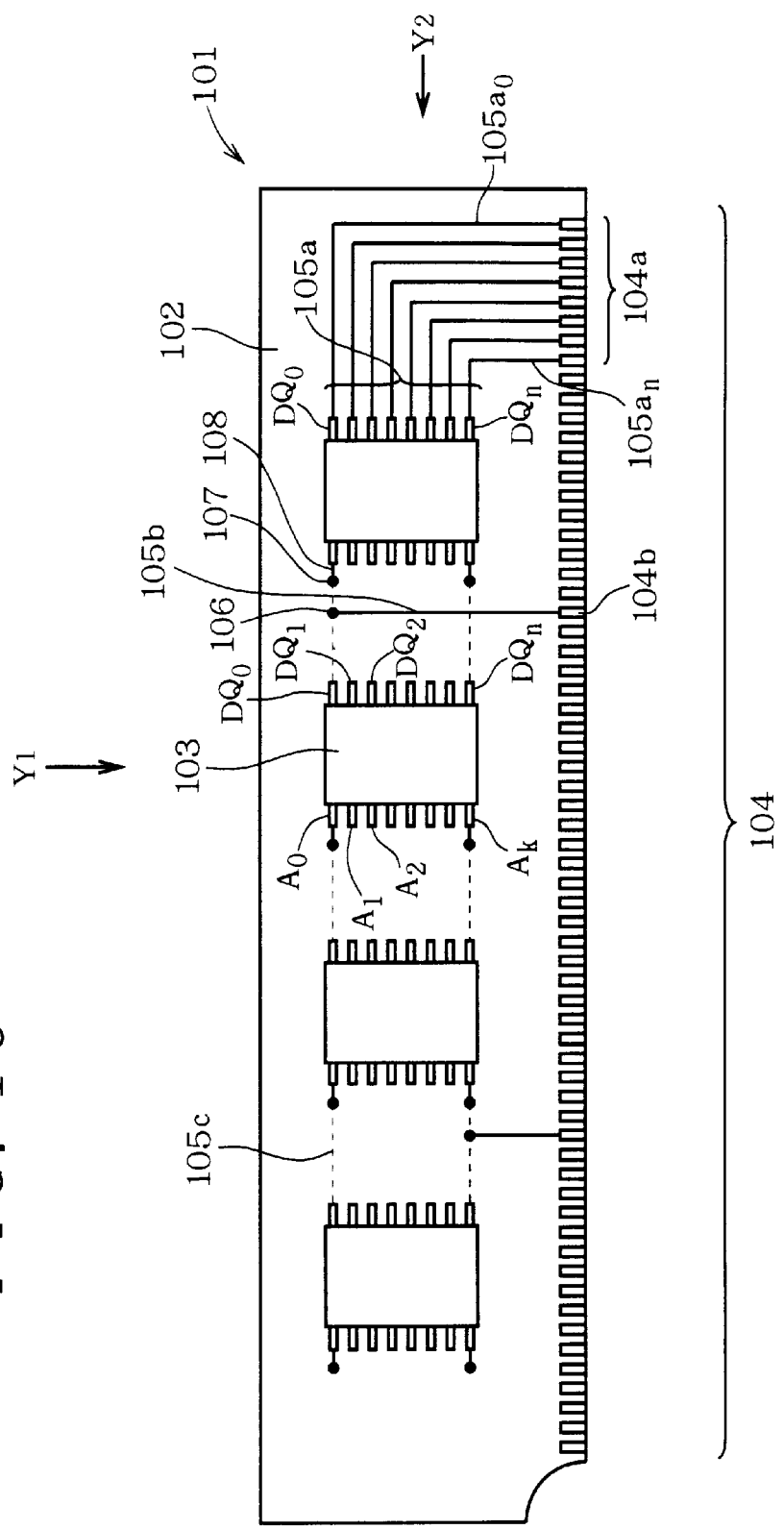
FIG. 16 is a front view of a conventional memory module.
Figure 17:
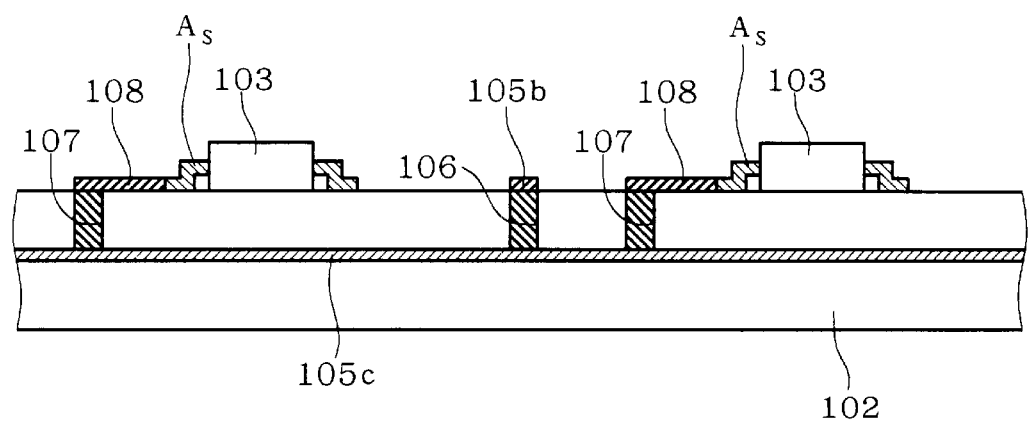
FIG. 17 is a sectional view of the conventional memory module.
Figure 18:
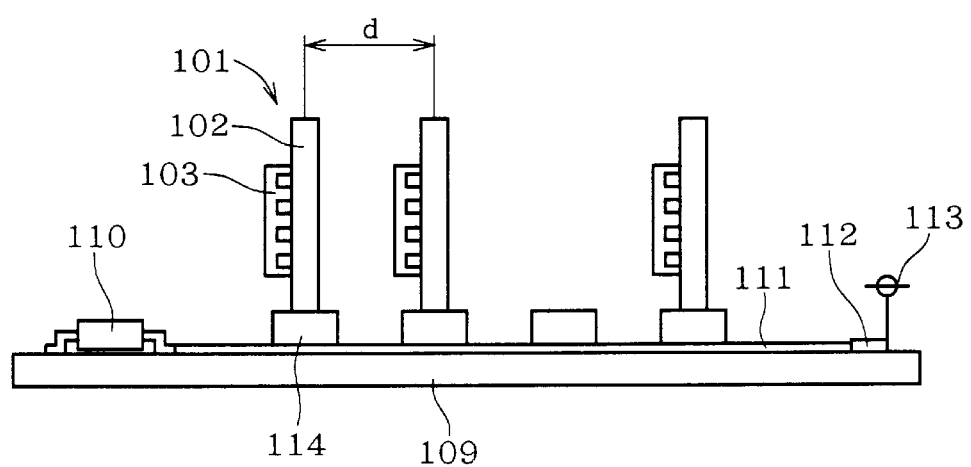
FIG. 18 is a side view showing the general configuration of a system including a plurality of conventional memory modules.
Figure 19:
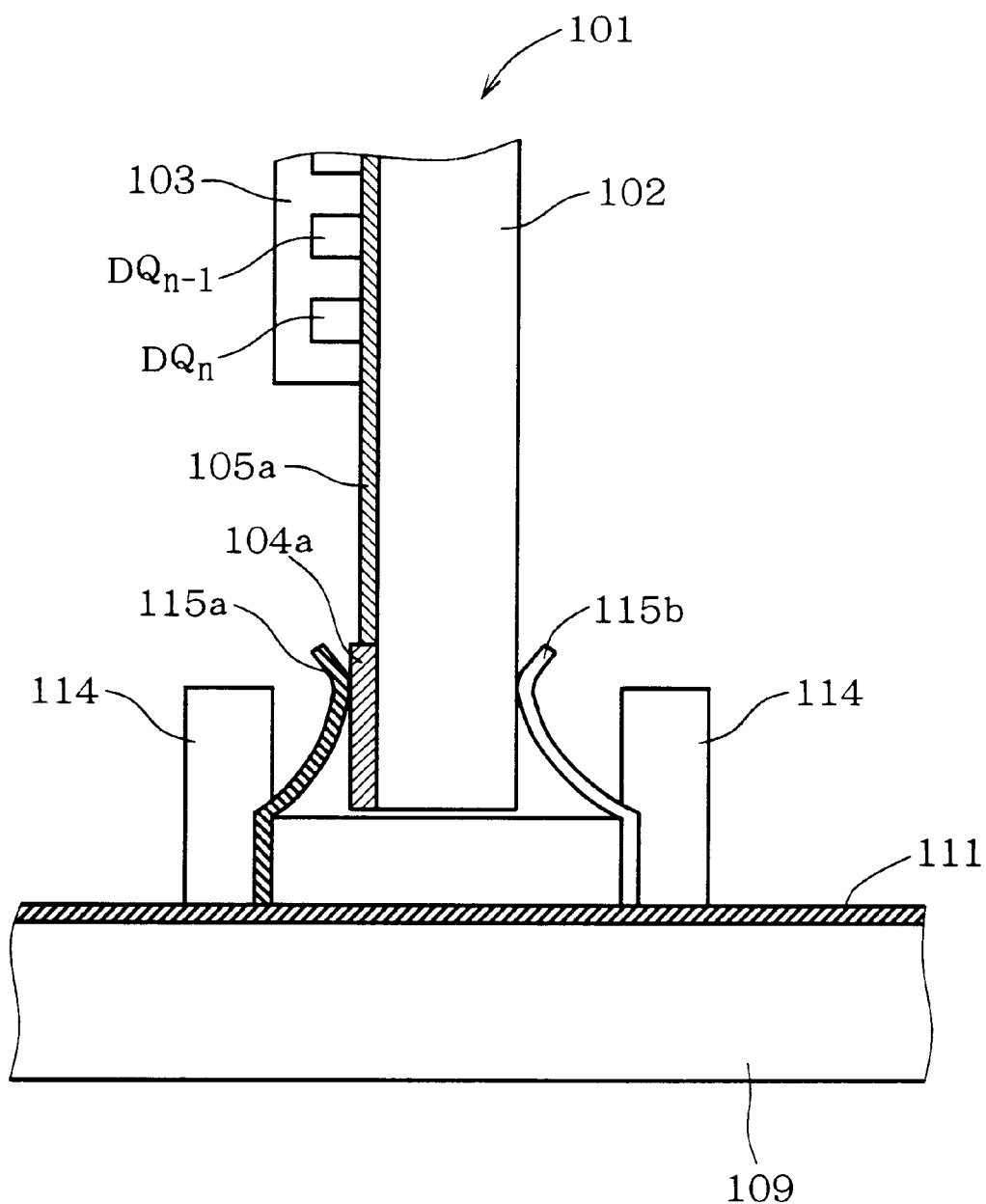
FIG. 19 is a sectional view of a connector with the conventional memory module inserted therein.
Figure 20:
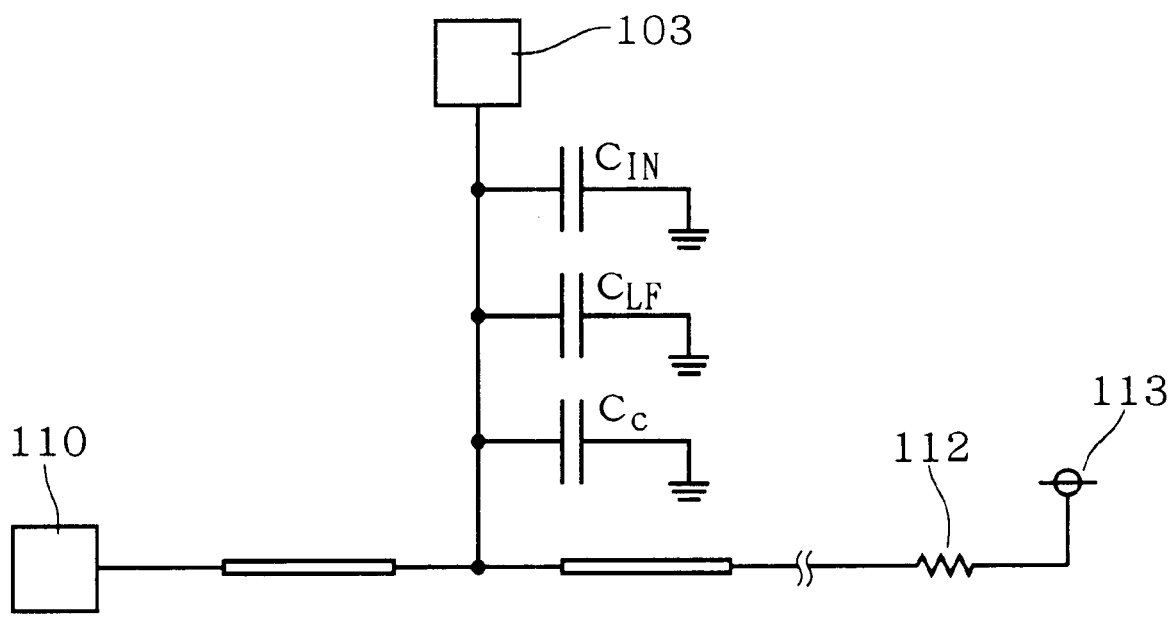
FIG. 20 is a circuit diagram of an equivalent circuit in consideration for the connector of FIG. 19 and the conventional memory module.

FIG. 15 is a schematic sectional view of a memory module 1g inserted in the connector 14 on the assumption that the system employs the memory module 1c. Similar to the memory module 1b and the like, the memory module 1g includes the connector terminal 4a, the interconnect line 5a, and the memory IC 3 with the data pin $DQ_t$ which are mounted on the front surface of the printed wiring board 2. The memory module 1g further includes the connector pin 23a, the interconnect line 5f, the capacitor 25a, the ground 26a, the terminating resistor 27a, and the power supply 28a which are provided on the back surface of the printed wiring board 2 and similar to those on the front surface of the module 20d. The connector terminal 4a and the connector terminal 23a are electrically connected to each other through the conductor which fills the through hole 22. The particular arrangement on the back surface of the memory module 1g is similar to the arrangement shown in FIG. 14. The memory module 1g is similar to the module 20d in that it is inserted in the next connector after the connector which receives the last memory module 1c. Although the connector terminals 4a and 23a are electrically connected to each other through the conductor which fills the through hole 22 with reference to FIG. 15, the metal interconnect line 17 provided on the side surface of the printed wiring board 2 may be used to electrically connect the connector terminals 4a and 23a to each other as illustrated in the third preferred embodiment.

When no memory ICs 3 are required on one of the surfaces of the memory module, such as the memory module 1g, but it is desired only to terminate the signal line 11a in the system employing the double-surface mounted memory module 1c, the memory module 20d shown in FIG. 13 may be used, with the capacitance of the capacitor 25a doubled.

In the fourth preferred embodiment, the module 20b or the module 20c must be inserted in all of the connectors 14 which are to receive neither the memory module 1b nor the memory module 1c. In the fifth preferred embodiment, on the other hand, it is sufficient to insert the module 20d or the memory module 1g only in the next connector after the connector which receives the last memory module 1b or the last memory module 1c. Therefore, the module 20d of the fifth preferred embodiment is effective in reducing costs as compared with the use of the module 20d of the fourth preferred embodiment, as well as in preventing the data signal reflection resulting from the characteristic impedance mismatching.

While the invention has been described in detail, the foregoing description is in all aspects illustrative and not restrictive. It is understood that numerous other modifications and variations can be devised without departing from the scope of the invention.

We claim:

1. A circuit module for insertion in a connector provided on a main surface of a motherboard including one and another signal lines separated from each other at said connector, said circuit module comprising:
   a connector terminal provided on one main surface of said circuit module and adapted for electrical connection to said one signal line through said connector;
   another connector terminal provided on an other main surface of said circuit module, said other main surface being opposite from said one main surface of said circuit module and adapted for electrical connection to said another signal line through said connector; and
   a conductor for providing electrical connection between said connector terminal of said circuit module and said another connector terminal of said circuit module.

2. The circuit module in accordance with claim 1,
   wherein said conductor fills a through hole extending from said one main surface of said circuit module to said other main surface of said circuit module.

3. The circuit module in accordance with claim 2,
   wherein said connector includes a plurality of connectors formed on said main surface of said motherboard,
   wherein an IC module having an IC mounted thereon is inserted in at least one connector of said plurality of connectors, and
   wherein said circuit module is inserted in one or a plurality of connectors not receiving said IC module.

4. The circuit module in accordance with claim 1,
   wherein said conductor is a metal interconnect line.

5. The circuit module in accordance with claim 4,
   wherein said connector includes a plurality of connectors formed on said main surface of said motherboard,
   wherein an IC module having an IC mounted thereon is inserted in at least one of said plurality of connectors, and
   wherein said circuit module is inserted in one or a plurality of connectors not receiving said IC module.

6. The circuit module in accordance with claim 1,
   wherein said connector includes a plurality of connectors formed on said main surface of said motherboard,
   wherein an IC module having an IC mounted on at least one side thereof is inserted in at least one connector of said plurality of connectors, and
   wherein said circuit module is inserted in one or a plurality of connectors not receiving said IC module.

7. The circuit module in accordance with claim 6, further comprising:
   a capacitive element formed on said one main surface of said circuit module; and
   an interconnect line formed on said one main surface of said circuit module for providing connection between said capacitive element and said connector terminal of said circuit module.

8. The circuit module in accordance with claim 7,
   wherein said IC module is an IC module having said IC mounted on both sides thereof,
   said circuit module further comprising:
      another capacitive element formed on said other main surface of said circuit module; and
      another interconnect line formed on said other main surface of said circuit module for providing connection between said another capacitive element and said another connector terminal of said circuit module.

9. The circuit module in accordance with claim 7,
   wherein said IC module is an IC module having said IC mounted on both sides thereof,
   said circuit module further comprising:
      an IC formed on said other main surface of said circuit module; and
      another interconnect line formed on said other main surface of said circuit module for providing connection between said IC of said circuit module and said another connector terminal of said circuit module.

10. The circuit module in accordance with claim 1,
    wherein said connector terminal includes a plurality of connector terminals,
    said circuit module further comprising:
       a plurality of interconnect lines formed on said one main surface and having one ends connected to said plurality of connector terminals, respectively; and
       an IC formed on said one main surface and including a plurality of terminals connected to other ends of said plurality of interconnect lines, respectively, wherein said plurality of terminals being arranged in a direction parallel to a direction in which said plurality of connector terminals are arranged.

11. A circuit module for insertion in an arbitrary connector provided on a main surface of a motherboard, said motherboard including a plurality of connectors provided on said main surface thereof for receiving as required an IC module comprising an IC mounted thereon, a controller provided on said main surface thereof for providing a signal to said IC, and a signal line provided on said main surface thereof and having one end connected to said controller, said circuit module comprising:

a connector terminal adapted for electrical connection to said signal line;

an interconnect line having one end connected to said connector terminal;

a terminating resistor having one end connected to another end of said interconnect line and another end receiving termination potential, wherein said signal line is separated at said connectors, wherein said IC module is inserted in each of such ones of said plurality of connectors that are positioned between said arbitrary connector and said controller, and wherein said IC module is not inserted in such ones of said plurality of connectors that are positioned farther from said controller than said arbitrary connector.

12. The circuit module in accordance with claim 11, further comprising:

a capacitive element connected to said interconnect line in common with said terminating resistor, wherein a capacitance of said capacitive element is equal to an input capacitance of said IC.

13. A circuit module comprising:

a board;

a plurality of connector terminals formed on a main surface of said board;

a plurality of interconnect lines having one ends connected to said plurality of connector terminals, respectively; and an IC in a shape of a rectangle formed on said main surface of said board and including a plurality of terminals arranged along a long side of said rectangle and connected to another ends of said plurality of interconnect lines, respectively, wherein said plurality of terminals are arranged in a direction parallel to a direction in which said plurality of connector terminals are arranged.

14. The circuit module in accordance with claim 13, wherein said IC is a memory IC, wherein said plurality of terminals are data pins for inputting and outputting a data signal, wherein said data pins are provided on a first side of said memory IC which is opposed to said connector terminals, wherein said memory IC further includes address/command pins provided on a second side thereof which is opposite from said first side, and wherein said address/command pins receive an address/command signal through a buffer IC provided on said main surface of said board.

15. The circuit module in accordance with claim 6, wherein said IC module comprises:

a connector terminal formed on one main surface of said IC module;

another connector terminal formed on the other main surface of said IC module opposite from said one main surface of said IC module; and a conductor for providing electrical connection between said connector terminal of said IC module and said another connector terminal of said IC module, wherein said connector receiving said IC module comprises:

a connector pin electrically connected to said connector terminal of said IC module; and another connector pin electrically connected to said another connector terminal of said IC module, and wherein one of said connector pin and said another connector pin is connected to one of said one signal line and said another signal line.

16. The circuit module in accordance with claim 7, wherein said IC module comprises:

a connector terminal formed on a main surface of said IC module;

said IC formed on said main surface of said IC module; and an interconnect line formed on said main surface of said IC module for providing connection between said connector terminal of said IC module and said IC, and wherein a total of a capacitance of said interconnect line of said circuit module and a capacitance of said capacitive element of said circuit module is approximately equal to a total of the capacitance of said interconnect line of said IC module and an input capacitance of said IC.

17. The circuit module in accordance with claim 8, wherein said IC module comprises:

a connector terminal formed on one main surface of said IC module;

another connector terminal formed on the other main surface of said IC module opposite from said one main surface of said IC module;

an IC formed on said one main surface of said IC module;

an interconnect line formed on said one, main surface of said IC module for providing connection between said connector terminal of said IC module and said IC;

another IC formed on said other main surface of said IC module; and another interconnect line formed on said other main surface of said IC module for providing connection between said another connector terminal of said IC module and said another IC, wherein a total of a capacitance of said interconnect line of said circuit module and a capacitance of said capacitive element of said circuit module is approximately equal to a total of a capacitance of said interconnect line of said IC module and an input capacitance of said IC, and wherein a total of a capacitance of said another interconnect line of said circuit module and a capacitance of said another capacitive element of said circuit module is approximately equal to a total of a capacitance of said another interconnect line of said IC module and an input capacitance of said another IC.

18. The circuit module in accordance with claim 9, wherein said IC module comprises:
- a connector terminal formed on one main surface of said IC module;
- another connector terminal formed on the other main surface of said IC module opposite from said one main surface of said IC module;
- an IC formed on said one main surface of said IC module;
- an interconnect line formed on said one main surface of said IC module for providing connection between said connector terminal of said IC module and said IC;
- another IC formed on said other main surface of said IC module; and
- another interconnect line formed on said other main surface of said IC module for providing connection between said another connector terminal of said IC module and said another IC,
  - wherein a total of a capacitance of said interconnect line of said circuit module and a capacitance of said capacitive element of said circuit module is approximately equal to a total of a capacitance of said interconnect line of said IC module and an input capacitance of said IC of said IC module, and
  - wherein a total of a capacitance of said another interconnect line of said circuit module and an input capacitance of said IC of said circuit module is approximately equal to a total of a capacitance of said another interconnect line of said IC module and an input capacitance of said another IC of said IC module.

19. A circuit module comprising:
a board;
a plurality of connector terminals formed on said board;
a plurality of memory ICs formed on a main surface of said board, each memory IC having a plurality of first terminals formed on one side of each memory IC and a plurality of second terminals formed on the opposite side of each memory IC to the one side; and
a plurality of interconnected lines connecting the respective plurality of first terminals of said plurality of memory ICs to said plurality of connector terminals, wherein
said plurality of first terminals of each memory IC are arranged opposite to said plurality of connector terminals and in a direction parallel to a direction in which said plurality of interconnected lines are arranged and only said plurality of first terminals of each memory IC include a plurality of data pins for inputting data signals to be stored therein and outputting data signal stored therein.

* * * * *